US012593651B2

(12) United States Patent
Hsu et al.

(10) Patent No.: US 12,593,651 B2
(45) Date of Patent: Mar. 31, 2026

(54) PAYLOAD TRANSPORTATION SYSTEM

(71) Applicant: Taiwan Semiconductor Manufacturing Company, Ltd., Hsin-Chu (TW)

(72) Inventors: Chieh Hsu, Hsinchu (TW); Guancyun Li, Miaoli County (TW); Ching-Jung Chang, Taichung (TW); Chi-Feng Tung, Maioli County (TW)

(73) Assignee: TAIWAN SEMICONDUCTOR MANUFACUTURING COMPANY, LTD., Hsinchu (TW)

( * ) Notice: Subject to any disclaimer, the term of this patent is extended or adjusted under 35 U.S.C. 154(b) by 426 days.

(21) Appl. No.: 18/194,428

(22) Filed: Mar. 31, 2023

(65) Prior Publication Data

US 2024/0021456 A1 Jan. 18, 2024

Related U.S. Application Data

(60) Provisional application No. 63/389,194, filed on Jul. 14, 2022.

(51) Int. Cl.
*H01L 21/677* (2006.01)
*H01L 21/687* (2006.01)

(52) U.S. Cl.
CPC .. *H01L 21/67733* (2013.01); *H01L 21/67766* (2013.01); *H01L 21/67769* (2013.01); *H01L 21/68707* (2013.01)

(58) Field of Classification Search
CPC ......... H01L 21/67733; H01L 21/67766; H01L 21/67769; H01L 21/68707
See application file for complete search history.

(56) References Cited

U.S. PATENT DOCUMENTS 7,139,628 B2 * 11/2006 Ni ........................ G06F 11/1464
                                                  700/99
7,684,888 B2 * 3/2010 Chen .................. G05B 19/4189
                                                  700/121
(Continued)

FOREIGN PATENT DOCUMENTS

KR        20210019789 A    2/2021
TW         201906054 A    2/2019
(Continued)

OTHER PUBLICATIONS

Chieh et al., "Wafer Transportation," U.S. Appl. No. 17/832,605, filed Jun. 4, 2022, Assignee: Taiwan Semiconductor Manufacturing Company, Ltd., 27 pages specification, 12 pages drawings.

*Primary Examiner* — Kyle O Logan
(74) *Attorney, Agent, or Firm* — HAYNES AND BOONE, LLP

(57) ABSTRACT

System and method for cross-fab wafer transportation are provided. A method includes providing a first FAB building and a second FAB building connected via a bridging area, the second FAB building comprising fabrication tools configured to perform fabrication processes different than fabrication processes performed by fabrication tools in the first FAB building, after performing fabrication processes in the first FAB building, configuring a first vehicle of the first FAB building to travel along a first OHT track and take the wafer to the bridging area, configuring a second vehicle of the second FAB building to travel along a second OHT track and arrive at the bridging area, where a portion of the first OHT track is in parallel with a portion of the second OHT track at the bridging area, when some predetermined conditions are met, configuring the first vehicle to transfer the wafer to the second vehicle.

20 Claims, 12 Drawing Sheets

(56)     References Cited

U.S. PATENT DOCUMENTS

| | | | | |
|---|---|---|---|---|
| 9,048,274 | B2 | 6/2015 | Wang et al. | |
| 2005/0216110 | A1* | 9/2005 | Chen | G05B 19/41865 |
| | | | | 700/99 |
| 2005/0240298 | A1* | 10/2005 | Ni | G06F 11/1464 |
| | | | | 700/99 |
| 2008/0281456 | A1* | 11/2008 | Chen | G05B 19/4189 |
| | | | | 700/112 |
| 2010/0023160 | A1* | 1/2010 | Chen | G05B 19/41895 |
| | | | | 198/804 |
| 2019/0067040 | A1 | 2/2019 | Kuo et al. | |
| 2020/0103869 | A1* | 4/2020 | Huang | G05B 19/4189 |
| 2021/0118709 | A1* | 4/2021 | Li | H01L 21/67724 |
| 2021/0249283 | A1 | 8/2021 | Lee et al. | |
| 2021/0349451 | A1 | 11/2021 | Huang | |
| 2022/0013395 | A1 | 1/2022 | Lin | |
| 2023/0133865 | A1* | 5/2023 | Oh | B66C 19/00 |
| | | | | 414/222.13 |

FOREIGN PATENT DOCUMENTS

| | | | |
|---|---|---|---|
| TW | 201925066 | A | 7/2019 |
| TW | 202129446 | A | 8/2021 |

* cited by examiner

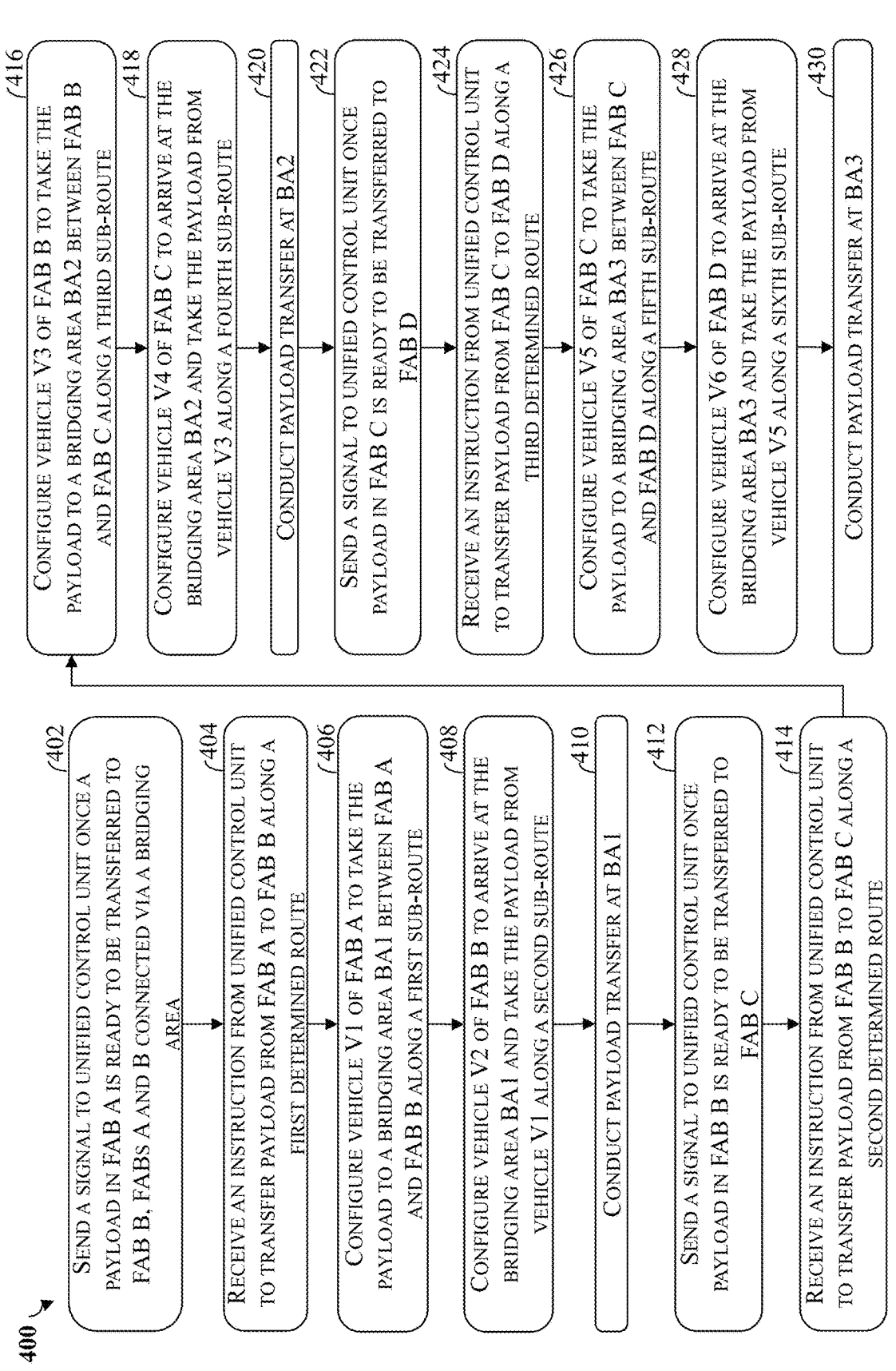

400

SEND A SIGNAL TO UNIFIED CONTROL UNIT ONCE A PAYLOAD IN FAB A IS READY TO BE TRANSFERRED TO FAB B, FABS A AND B CONNECTED VIA A BRIDGING AREA — 402

RECEIVE AN INSTRUCTION FROM UNIFIED CONTROL UNIT TO TRANSFER PAYLOAD FROM FAB A TO FAB B ALONG A FIRST DETERMINED ROUTE — 404

CONFIGURE VEHICLE V1 OF FAB A TO TAKE THE PAYLOAD TO A BRIDGING AREA BA1 BETWEEN FAB A AND FAB B ALONG A FIRST SUB-ROUTE — 406

CONFIGURE VEHICLE V2 OF FAB B TO ARRIVE AT THE BRIDGING AREA BA1 AND TAKE THE PAYLOAD FROM VEHICLE V1 ALONG A SECOND SUB-ROUTE — 408

CONDUCT PAYLOAD TRANSFER AT BA1 — 410

SEND A SIGNAL TO UNIFIED CONTROL UNIT ONCE PAYLOAD IN FAB B IS READY TO BE TRANSFERRED TO FAB C — 412

RECEIVE AN INSTRUCTION FROM UNIFIED CONTROL UNIT TO TRANSFER PAYLOAD FROM FAB B TO FAB C ALONG A SECOND DETERMINED ROUTE — 414

CONFIGURE VEHICLE V3 OF FAB B TO TAKE THE PAYLOAD TO A BRIDGING AREA BA2 BETWEEN FAB B AND FAB C ALONG A THIRD SUB-ROUTE — 416

CONFIGURE VEHICLE V4 OF FAB C TO ARRIVE AT THE BRIDGING AREA BA2 AND TAKE THE PAYLOAD FROM VEHICLE V3 ALONG A FOURTH SUB-ROUTE — 418

CONDUCT PAYLOAD TRANSFER AT BA2 — 420

SEND A SIGNAL TO UNIFIED CONTROL UNIT ONCE PAYLOAD IN FAB C IS READY TO BE TRANSFERRED TO FAB D — 422

RECEIVE AN INSTRUCTION FROM UNIFIED CONTROL UNIT TO TRANSFER PAYLOAD FROM FAB C TO FAB D ALONG A THIRD DETERMINED ROUTE — 424

CONFIGURE VEHICLE V5 OF FAB C TO TAKE THE PAYLOAD TO A BRIDGING AREA BA3 BETWEEN FAB C AND FAB D ALONG A FIFTH SUB-ROUTE — 426

CONFIGURE VEHICLE V6 OF FAB D TO ARRIVE AT THE BRIDGING AREA BA3 AND TAKE THE PAYLOAD FROM VEHICLE V5 ALONG A SIXTH SUB-ROUTE — 428

CONDUCT PAYLOAD TRANSFER AT BA3 — 430

FIG. 4

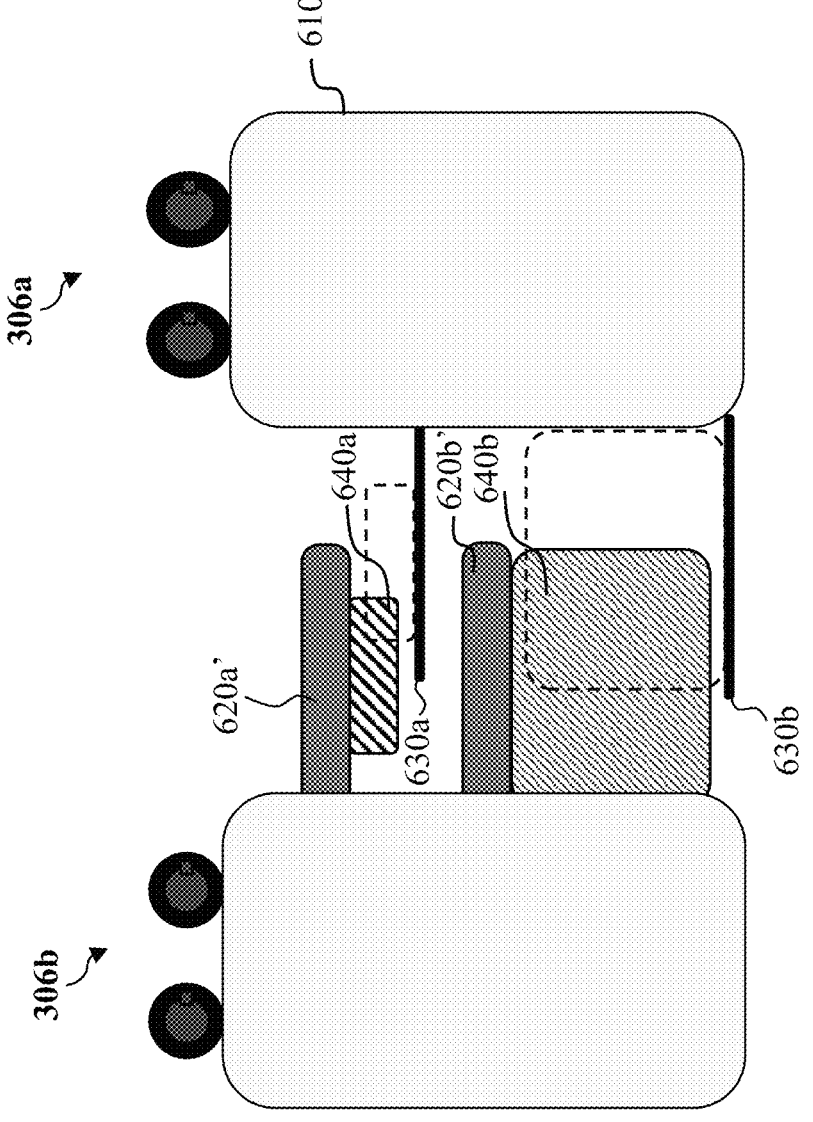
FIG. 6B
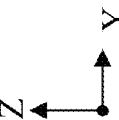

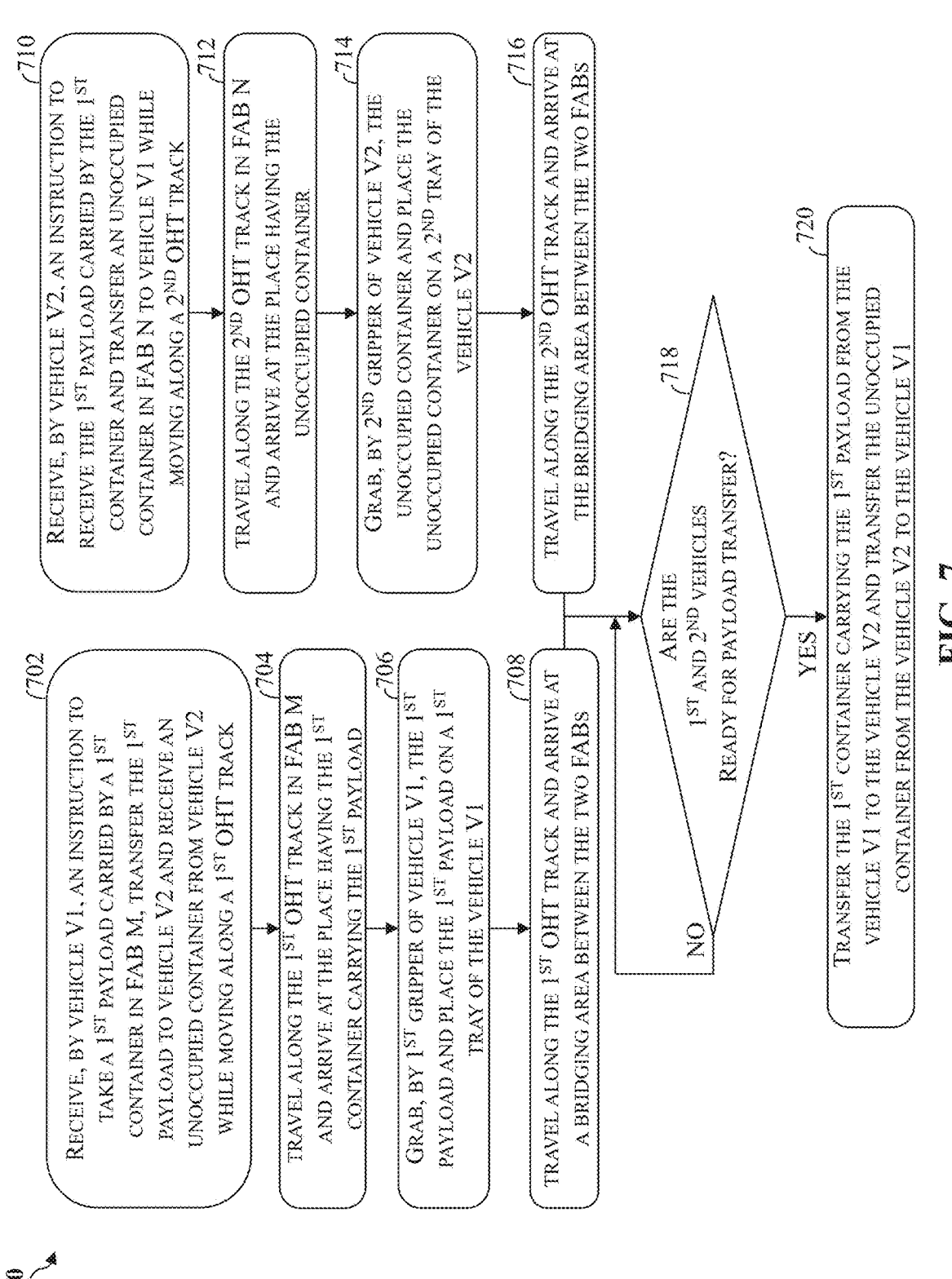

700

702 — RECEIVE, BY VEHICLE V1, AN INSTRUCTION TO TAKE A 1ST PAYLOAD CARRIED BY A 1ST CONTAINER IN FAB M, TRANSFER THE 1ST PAYLOAD TO VEHICLE V2 AND RECEIVE AN UNOCCUPIED CONTAINER FROM VEHICLE V2 WHILE MOVING ALONG A 1ST OHT TRACK

704 — TRAVEL ALONG THE 1ST OHT TRACK IN FAB M AND ARRIVE AT THE PLACE HAVING THE 1ST CONTAINER CARRYING THE 1ST PAYLOAD

706 — GRAB, BY 1ST GRIPPER OF VEHICLE V1, THE 1ST PAYLOAD AND PLACE THE 1ST PAYLOAD ON A 1ST TRAY OF THE VEHICLE V1

708 — TRAVEL ALONG THE 1ST OHT TRACK AND ARRIVE AT A BRIDGING AREA BETWEEN THE TWO FABS

710 — RECEIVE, BY VEHICLE V2, AN INSTRUCTION TO RECEIVE THE 1ST PAYLOAD CARRIED BY THE 1ST CONTAINER AND TRANSFER AN UNOCCUPIED CONTAINER IN FAB N TO VEHICLE V1 WHILE MOVING ALONG A 2ND OHT TRACK

712 — TRAVEL ALONG THE 2ND OHT TRACK IN FAB N AND ARRIVE AT THE PLACE HAVING THE UNOCCUPIED CONTAINER

714 — GRAB, BY 2ND GRIPPER OF VEHICLE V2, THE UNOCCUPIED CONTAINER AND PLACE THE UNOCCUPIED CONTAINER ON A 2ND TRAY OF THE VEHICLE V2

716 — TRAVEL ALONG THE 2ND OHT TRACK AND ARRIVE AT THE BRIDGING AREA BETWEEN THE TWO FABS

718 — ARE THE 1ST AND 2ND VEHICLES READY FOR PAYLOAD TRANSFER?

NO

YES

720 — TRANSFER THE 1ST CONTAINER CARRYING THE 1ST PAYLOAD FROM THE VEHICLE V1 TO THE VEHICLE V2 AND TRANSFER THE UNOCCUPIED CONTAINER FROM THE VEHICLE V2 TO THE VEHICLE V1

FIG. 7

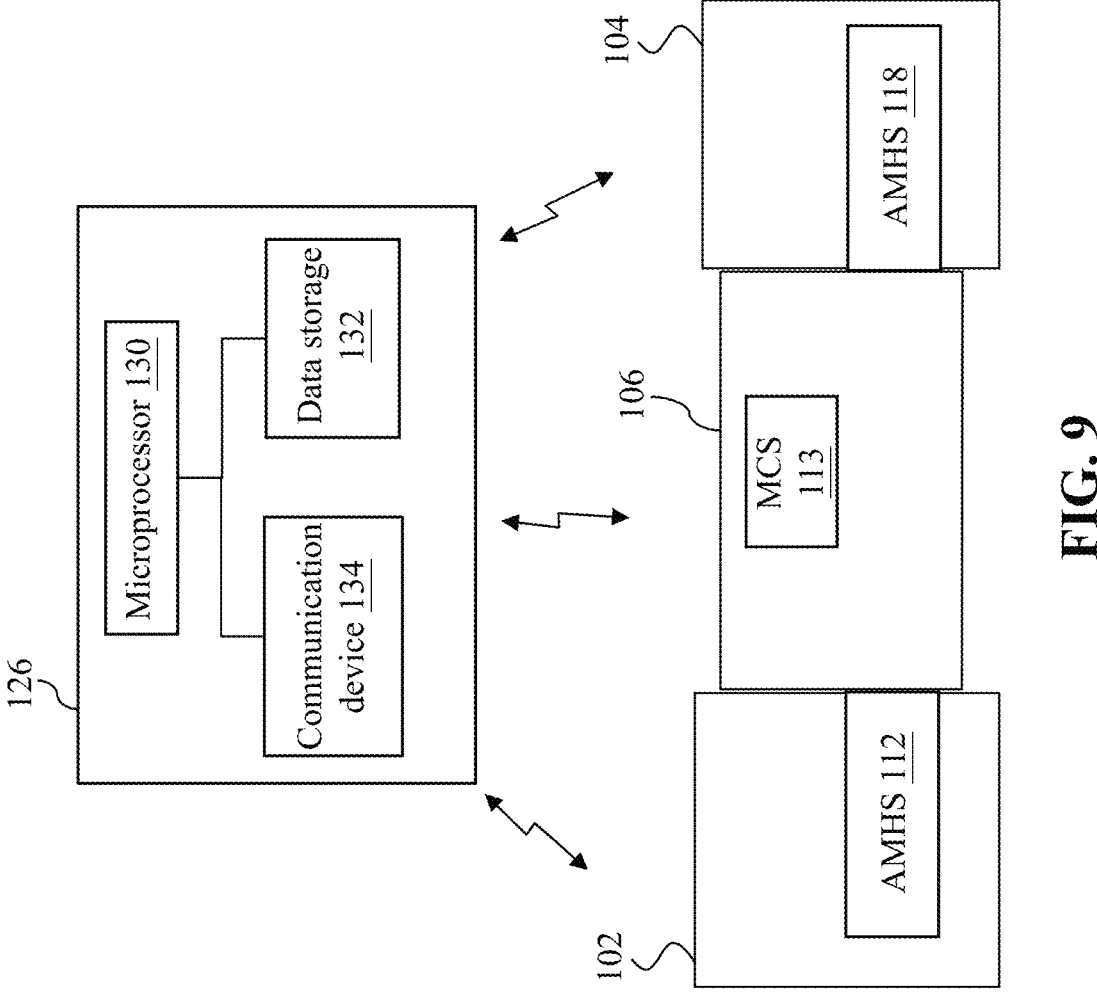
FIG. 9

PAYLOAD TRANSPORTATION SYSTEM

PRIORITY DATA

This application claims priority to U.S. Provisional Patent Application Ser. No. 63/389,194 filed Jul. 14, 2022, the entire disclosure of which is hereby incorporated herein by reference.

BACKGROUND

During manufacturing of a semiconductor device, the device is usually processed at many workstations or process tools. To accommodate the workstations or process tools, many semiconductor fabrication facilities/plants, or "FABs" may be built. Semiconductor fabrication facilities that are clustered in a campus setting or an industrial complex may be referred to as a FAB cluster. The transporting or conveying of a partially finished device, or a work-in-process (WIP) part, is an important aspect in the total manufacturing process. The conveying of semiconductor wafers is especially important in the manufacturing of integrated circuit (IC) chips due to the delicate nature of the chips. Furthermore, in fabricating an IC product, a multiplicity of fabrication steps is usually performed to complete the fabrication process. The fabrication process often results in the need for cross-phase transfer within a single FAB and/or cross-fab transfer between FABs of the FAB cluster.

Automated material handling systems ("AMHSs") have been widely used in manufacturers to automatically handle and transport groups or lots of wafers between various process tools used in chip manufacturing. Although existing systems and methods have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4 depicts a flow chart illustrating an exemplary method of performing a cross-fab transfer process in the FAB cluster as shown in FIG. 3.

FIG. 6B illustrates a simplified schematic diagram of two vehicles operating in different modes during the cross-fab transfer process, according to one or more embodiments of the present disclosure.

FIG. 7 depicts a flow chart illustrating an exemplary method of configuring the vehicles to perform operations to conduct the cross-fab transfer process, according to one or more embodiments of the present disclosure.

FIG. 9 is a simplified block diagram of another alternative FAB cluster, according to one embodiment of the present disclosure.

DETAILED DESCRIPTION

Figure 1:
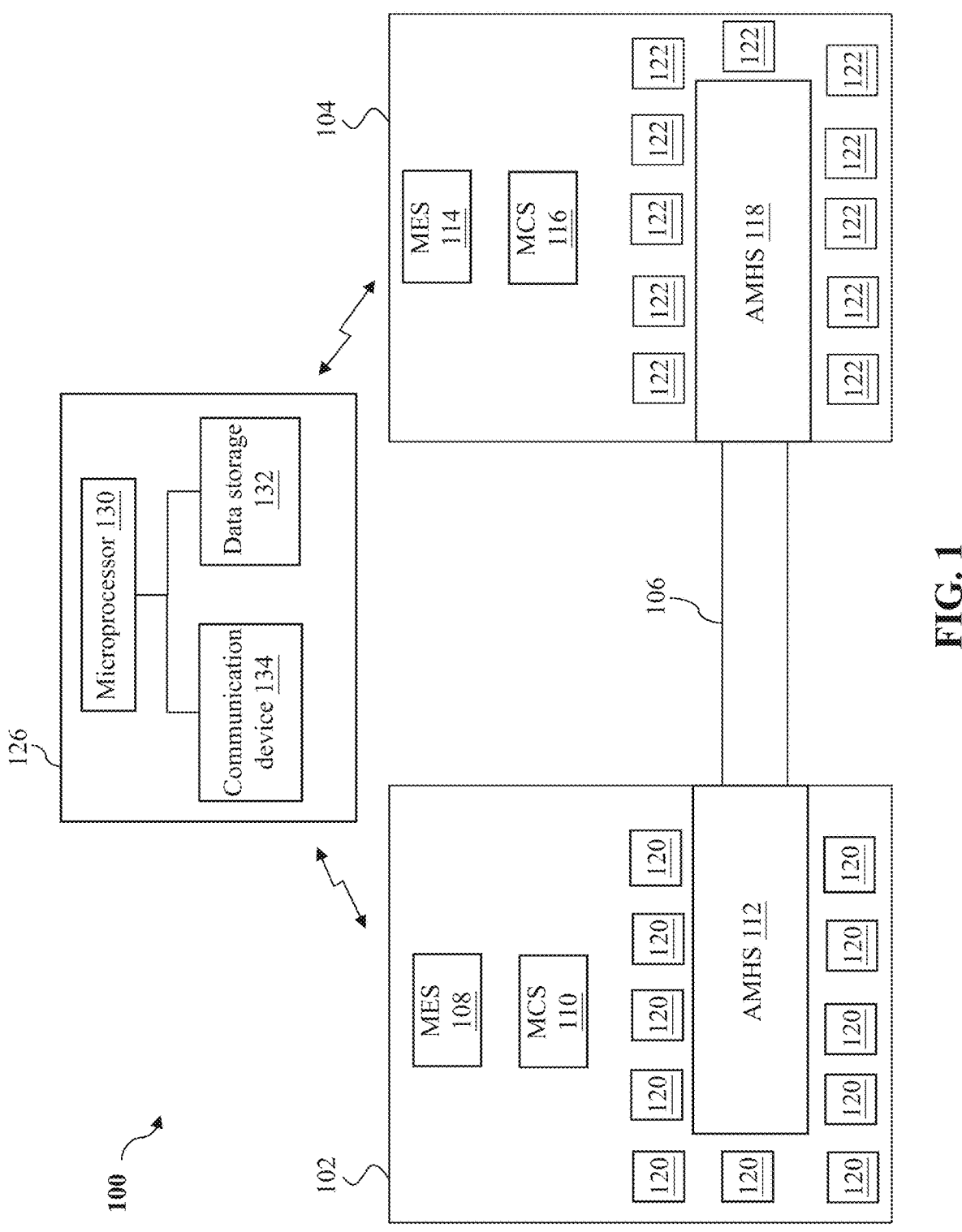
FIG. 1 illustrates a block diagram of a simplified FAB cluster, according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

A FAB cluster may include a number of FABs built in a campus setting or an industrial complex. During the fabrication process, a payload (e.g., wafer(s)) may be placed in a payload container/carrier (e.g., a front opening unified pod "FOUP") and transferred among the FABs for different steps of the manufacturing process. A "cross-fab transfer" involves the transfer of the payload from one FAB to another. The two FABs of the FAB cluster may be connected by a bridging area (e.g., a corridor bridge, a skyway bridge). A "cross-AMHS transfer" involves the transfer of a payload from one automated material handling system ("AMHS") to another AMHS, regardless of whether the AMHSs are separate systems within a single FAB or systems in separate FABs. Each FAB may include multiple phases. A "cross-phase transfer" involves the transfer of a payload from one phase to another. Each phase of a FAB includes a plurality of bays that may include process tools or equipment. The equipment within each bay may be interconnected by an intrabay overhead transport ("OHT") system. The bays may be interconnected with the other bays via an interbay OHT system. As will be familiar to those of ordinary skill in the relevant art, the intrabay OHT systems and the interbay OHT system include overhead tracks on which OHT vehicles transport payload containers (e.g., FOUPs) containing payloads (e.g., lots of wafers) to be processed to and from the equipment of the bays, often via stockers.

In some technologies, a "cross-fab" transfer may include placing interface devices (e.g., stockers) at the bridging area and selecting an interface device that is accessible by both OHT vehicles of a first FAB and OHT vehicles of a second FAB, configuring a vehicle of a first OHT system to take the payload container from the process tools or equipment of the first FAB to the selected interface device that is used to temporarily hold the payload container, and configuring a vehicle of a second OHT system to take the payload container from the selected interface device to the process tools or equipment of the second FAB. Such kind of "cross-fab" transfer increases transportation volume and may cause traffic jam. In addition, more clean room space is needed in order to arrange interface devices to implement the "cross-fab" transfer. A "cross-AMEIS transfer" and a "cross-phase transfer" also encounter similar issues.

The present disclosure provides systems and methods of performing the cross-fab transfer. A FAB cluster includes several FABs having different process tools configured to conduct, for example, different fabrication steps. In some embodiments, transistors may be formed in a first FAB, and testing of the transistors may be performed in a second FAB. An OHT system of a first FAB has an OHT track that is partially parallel to an OHT track of a OHT system of a second FAB. The partially paralleled portions of the OHT tracks are at the bridging area of the first and second FABs. After fabrication steps that should be performed in the first FAB are finished, a vehicle of the first FAB may take the payload and transfer it to a vehicle of the second FAB without temporarily putting the payload on the interface device placed at the bridging area. Thus, the cross-fab transfer process is simplified, and efficiency of cross-fab transfer process may be advantageously improved. In addition, less clean room spaces may be occupied by interface devices. In some embodiments, the vehicle(s) may be operable to carry/hold two payload containers at the same time, thereby further improving transportation efficiency and reducing traffic jams. The present disclosure may also be applied for a cross-phase transfer and a cross-AMHS transfer.

FIG. 1 illustrates a block diagram of a simplified FAB cluster 100. In the present embodiments, the FAB cluster 100 includes a FAB 102 and a FAB 104 connected by a bridging area 106. In some embodiments, the FAB 102 and the FAB 104 each may include one or more buildings. In an embodiment, the FAB 102 includes a first building, and the FAB 104 includes a second building spaced apart from the first building, and the bridging area 106 is a corridor bridge connecting the first and second buildings. The FAB 102 includes a manufacturing execution system ("MES") 108, a material control system (MCS) 110, and an automated material handling system (AMHS) 112. The FAB 104 includes a MES 114, a MCS 116, and an AMHS 118. When a payload container (e.g., a front opening unified pod ("FOUP")) is to be transferred, the MES (e.g., the MES 108 or the MES 114) determines to which destination in the FAB (e.g., the FAB 102 or the FAB 104) the payload container should be transferred. Once the destination decision has been made, the MES sends a transfer request to the MCS (e.g., the MCS 110 or the MCS 116), which calculates a detailed transportation route using a route search engine and then notifies, for example, the AMHS to execute the transfer step-by-step. It is understood that the MESs 108 and 114, the MCSs 110 and 116, and the AMHSs 112 and 118 may include a number of components as is known in the art. For example, but without limitation, each of the AMHSs 112 and 118 may include a number of control modules, such as a reticule stocker controller, a stocker controller, an overhead buffer controller, an inter-bay OHT controller, an intra-bay OHT controller, and/or a lifter controller. The AMHSs 112 and 118 may include additional, fewer, and different control modules in some embodiments. It is understood that the FAB cluster 100 may have other numbers of FABs.

The bridging area 106 represents the connection between the FAB 102 and the FAB 104. In some embodiments, the bridging area 106 may be a corridor bridge, or a skyway bridge, for example. The length of the bridging area 106 may be greater than 10 meters. The bridging area 106 connects the FABs such that a payload container may be passed from one FAB to another. Thus, in some embodiments, the bridging area 106 is an area where two or more AMHSs may operate together. In this manner, the payload container may be transferred across multiple FAB s by passing control of the payload container from one FAB to another at the bridging area 106. The bridging area 106 may facilitate transferring a payload container from the FAB 102 to the FAB 104, from the FAB 104 to the FAB 102, or both. In some embodiments, the bridging area 106 may connect more than two FABs to one another. In some other embodiments, the bridging area 106 may also represent the connection between two AMHSs. In an embodiment, the AMHSs 112 and 118 may be from different vendors.

The FAB 102 includes a number of equipment 120 (e.g., process tools, stockers). The process tools in the FAB 102 may be used to perform a number of fabrication processes (e.g., front-end-of-line (FEOL) processes related to fabricating integrated circuit (IC) devices, such as transistors) to a wafer. The equipment 120 in the FAB 102 are serviced by the AMHS 112. The FAB 104 also includes a number of equipment 122 (e.g., process tools, stockers). The process tools in the FAB 104 may be implemented to perform a number of fabrication processes (e.g., back-end-of-line (BEOL) processes related to fabricating a multilayer interconnect (MLI) structure that interconnects features fabricated by the FEOL process) different than the fabrication processes performed in the FAB 102. The equipment 122 in the FAB 104 are serviced by the AMHS 118.

The FAB cluster 100 also includes a unified control unit 126. In the present embodiments, the unified control unit 126 is configured to communicate with each of the FAB s 102 and 104 and facilitate and/or organize transportation of payloads between the FAB s 102 and 104. In that regard, the unified control unit 126 may act as a server for receiving and providing information and/or instructions to each of the FABs 102-104. The unified control unit 126 may also act as a communication link between FABs such that the MES, MCS, and/or other systems of each FAB may communicate with the systems of another fab. The unified control unit 126 may include hardware, software, or a combination thereof. In some embodiments, the unified control unit 126 is a stand-alone unit separate from the MES, MCS, and other systems of each fab. In other embodiments, the unified control unit 126 may be a component or part of at least one of the FAB s. In at least some embodiments, communication between the unified control unit 126 and the FAB s 102-104 is by Common Object Request Broker Architecture ("CORBA"). Further, communication between components of the unified control unit 126 and communication between components of the FABs 102 and 104 may utilize CORBA. However, in other embodiments other communication protocols and/or middleware may be used. In the present embodiments, the unified control unit 126 is configured to synchronize the MES 108 and 114, the MCSs 110 and 116, and/or the AMHSs 112 and 118 of the FAB s 102 and 104 to facilitate transportation of a payload between the FAB 102 and the FAB 104. In some embodiments, the unified control unit 126 may be configured to facilitate transportation of an empty payload container between the FAB 102 and the FAB 104.

In embodiments represented in FIG. 1, the unified control unit 126 includes a microprocessor 130 configured to perform operations to execute the payload transfer or payload container transfer between different FAB s. The microprocessor 130 may receive data from and transmit data to the MCSs 110 and 116 of the FABs 102 and 104, respectively. In particular, the microprocessor 130 is configured to communicate with each of the MCSs 110 and 116 such that a cross-fab transfer can be synchronized across the different FABs 102 and 104 by sending appropriate signals to the MCSs. For example, the microprocessor 130 determines whether a vehicle associated with the AMHS 112 in the FAB 102 may directly transfer the payload to a vehicle associated with the AMHS 118 in the FAB 104 without using interface devices at the bridging area 106.

The microprocessor 130 is coupled to a data storage 132. The data storage 132 may include program instructions to generate commands to the MCSs 110 and 116. For example, the data storage 132 may store instructions that, when executed by the microprocessor 130, cause the microprocessor 130 to perform operations to provide sub-route requests to each of the MCSs. Detailed description of the operations that may be performed by the microprocessor 130 will be described with reference to FIGS. 2A-2B. The data storage 132 may include a non-volatile memory (NVM), one or more databases containing information regarding available transfer patterns for each FAB, available transfer patterns between FAB s, information regarding the MES and/or AMHS mappings for each FAB, and/or other information related to the transferring of payloads.

The transfer patterns may represent the available routes for transferring a payload between a first position in a first FAB and a second position in a second FAB. In some embodiments, the transfer patterns are dynamic and may be updated by factors such as static and dynamic traffic conditions, lot information, lot priority, available routes, route distances, maintenance schedules, and/or other factors. In some embodiments, the route of a cross-fab transfer may be broken down into sub-routes comprised of transfers within a single FAB and transfers across a bridging area. Multiple sub-routes may be linked together to create a full transfer route. In some embodiments, the transfer patterns may be based on available combinations of sub-routes for achieving the desired transfer. The microprocessor 130 may be configured to synchronize the multiple AMHSs to facilitate the transfer of the payload. In some embodiments, to execute a cross-fab transfer, the microprocessor 130 may be configured to provide a selected full transfer route which is formed by a number of sub-routes and then communicate sub-routes requests associated with the corresponding sub-routes with the corresponding AMHSs for execution. By coordinating the AMHSs, the cross-fab transfer request can be properly executed.

The MES and AMHS mapping provide static information regarding the available routing within the individual FABs and AMHSs that is combined to form a global mapping across the multiple MESs and AMHSs. In that regard, the MES and AMHS mapping may include the location of various tools and equipment among the FABs and AMHSs that can be utilized in route planning and assessment. While in some of the embodiments described below, there appears to be a single route between positions, this is simply for the sake of clarity and example and should not be considered limiting. Rather, it is fully contemplated that there could be multiple routes for transferring a payload container between AMHSs from one position to another position.

While the FAB cluster 100 has been described as having a particular combination of components, it is understood that the FAB cluster 100 may have fewer or greater components as would be apparent to one skilled in the art. For example, the unified control unit 126 may also include a user interface engine coupled to the microprocessor 130. For example, a user may input data through a user interface to select/configure different settings or different parameters. In addition, the functions of some of the various components may be combined into a single component and/or functions of a single component may be split out into multiple components. In other embodiments, the FAB cluster 100 may include additional FABs in communication with the unified control unit 126. Cross-fab transfer can be extended to the additional FABs in a manner similar to that described above with respect to FABs 102 and 104. Detailed description of the FAB cluster that includes additional FABs in communication with the unified control unit 126 will be described with reference to FIGS. 3-5.

Figure 2A:
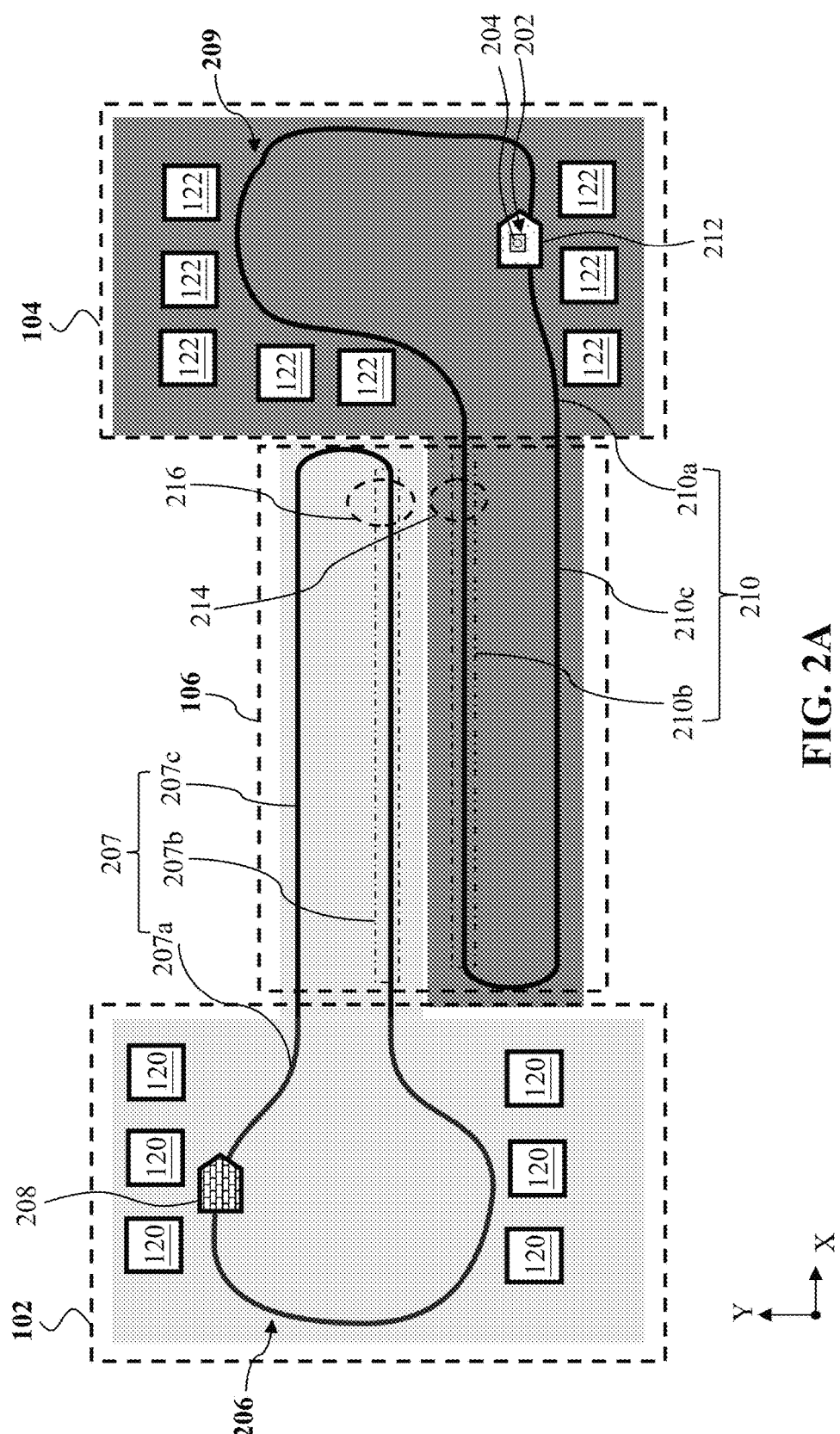
FIGS. 2A and 2B are simplified fragmentary schematic diagrams illustrating different stages of a cross-fab transfer process in the FAB cluster, according to one or more embodiments of the present disclosure.
Figure 2B:
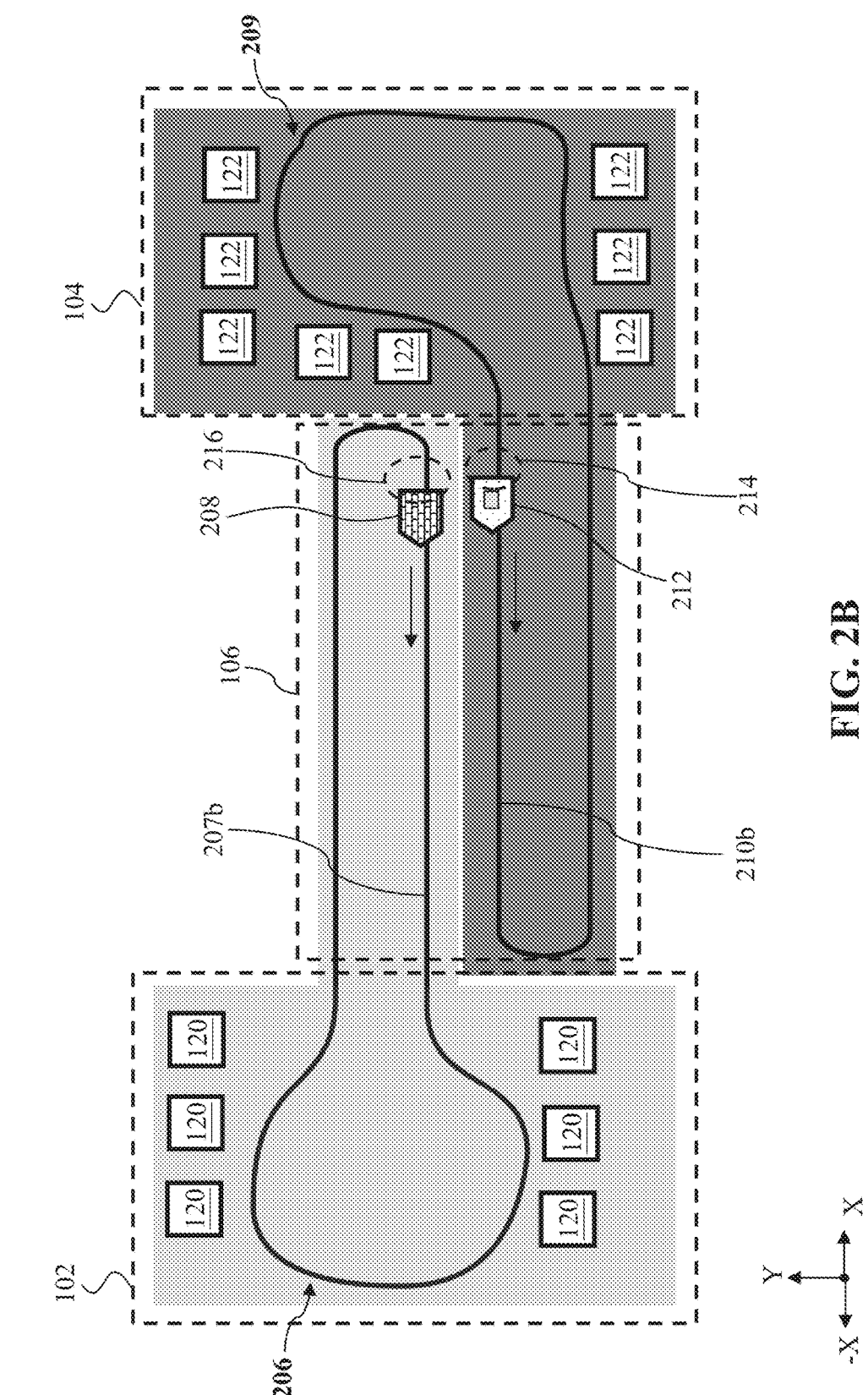

FIGS. 2A and 2B are simplified fragmentary schematic diagrams illustrating different stages of a cross-fab payload transportation process. In an example, a "cross-fab transfer job" involves the transfer of a payload container 202 from the FAB 104 to the FAB 102. The payload container 202 may include a front opening unified pod (FOUP), a front opening shipping box (FOSB), a reticle container, a tray cassette, a frame cassette, a magazine cassette, or other suitable carriers. The payload container 202 is operable to carry a payload 204. The payload 204 may include wafers, photomasks (or reticles), or other suitable payloads. In the present embodiments, the payload container 202 that contains payload 204 will be transferred from the FAB 104 to the FAB 102.

Referring to FIG. 2A, the FAB 102 may include a number of bays, and each bay includes equipment 120 (e.g., process tools, stockers, or other equipment). The equipment 120 within each bay of the FAB 102 is interconnected by an intrabay overhead transport ("OHT") system, and the bays of the FAB 102 may be interconnected via an interbay OHT system. The FAB 104 may include a number of bays, and each bay includes equipment 122 (e.g., process tools, stockers, or other equipment). Similarly, the equipment 122 within each bay of the FAB 104 is interconnected by another intrabay overhead transport ("OHT") system, and the bays of the FAB 104 may be interconnected via another interbay OHT system. The intrabay OHT system and the interbay OHT system may be collectively or separately referred to as an OHT system.

In the present embodiments, the OHT system 206 of the AMHS 112 includes overhead tracks or overhead rails (such as overhead track 207) on which first-type OHT vehicles (such as vehicle 208) transport payload containers to and from equipment 120. The OHT system 209 of the AMHS 118 includes overhead tracks or overhead rails (such as overhead track 210) on which second-type OHT vehicles (such as vehicle 212) transport payload container to and from equipment 122. The OHT system 206 and the OHT system 209 may be provided by different vendors. In embodiments represented in FIG. 2A, the overhead track 207 of the OHT system 206 includes a portion 207a arranged within the FAB 102 and a portion (i.e., the combination of a portion 207b and a portion 207c) arranged in the bridging area 106. That is, the service range of the OHT system 206 includes both the FAB 102 and a portion of the bridging area 106. The overhead track 210 of the OHT system 209 includes a portion 210a arranged within the FAB 104 and a portion (i.e., the combination of a portion 210b and a portion 210c) arranged in the bridging area 106. That is, the service range of the OHT system 209 includes both the FAB 104 and a portion of the bridging area 106. In the present embodiments, the portion 207b of the overhead track 207 is in proximity of the portion 210b of the overhead track 210. More specifically, the portion 207b of the overhead track 207 is adjacent to and in parallel with the portion 210b of the overhead track 210.

As described above, the FAB cluster 100 includes the unified control unit 126. To transfer the payload 204 from an equipment 122 in the FAB 104 to a target equipment 120 in the FAB 102, in response to a cross-fab transfer request, the microprocessor 130 may select an appropriate route for transferring the payload container 202 that carrying payload 204 from an equipment 122 to the target equipment 120 and communicates the sub-routes to the MCS 110 and the MCS 116, respectively. After receiving signals (e.g., information related to the sub-route) from the MCS 116, the vehicle 212 is configured to take the payload container 202 that contains payload 204 from the equipment 122 (e.g., a stocker) in the FAB 104 and move along the overhead track 210 to arrive at a predetermined location 214 at a predetermined time or within a predetermined duration. In an embodiment, the vehicle 212 includes a tray configured to hold the payload container 202. The predetermined location 214 is within the portion 210b of the overhead track 210. After receiving instructions from the MCS 110, the vehicle 208 starts travelling along the overhead track 207 to arrive at a predetermined location 216 at the same predetermined time or within the same predetermined duration. The predetermined location 216 is within the portion 207b of the overhead track 207 and substantially aligns with the predetermined location 214 along the Y direction.

Referring now to FIG. 2B, after travelling along the respective overhead track for a duration, the vehicle 212 arrives at the predetermined location 214 at the predetermined time and the vehicle 208 arrives at the predetermined location 216 substantially at the same time. In the present embodiments, to reduce traffic jam, after arriving at the respective predetermined locations 214 and 216, both the vehicles 208 and 212 continue travelling along its respective track. More specifically, after arriving at the respective predetermined locations 214 and 216, the vehicle 212 moves on the portion 210b of the overhead track 210 along the –X direction at a first speed, and the vehicle 208 moves on the portion 207b of the overhead track 207 along the –X direction at a second speed. In an embodiment, the first speed is equal to the second speed such that the vehicle 208 and the vehicle 212 are relatively stationary. In some embodiments, a speed difference between the first speed and the second speed is less than a predetermined threshold (e.g., such that the vehicle 208 and the vehicle 212 are deemed as stationary relative to one another. After both the vehicle 208 and the vehicle 212 arrive at its respective predetermined location and are stationary relative to one another, an alignment module on the vehicle 212 may determine whether the vehicle 208 is aligned with the vehicle 212. In some embodiments, the alignment module may include an image sensor, a laser sensor, a tilt-angle sensor, other suitable devices, and/or combinations thereof. After the vehicle 208 and the vehicle 212 are aligned and stationary relative to one another, the payload container 202 that contains payload 204 is directly transferred from the vehicle 212 to the vehicle 208. In an exemplary process, the tray of the vehicle 212 may slide out from a main body of the vehicle 212, and a gripper of the vehicle 208 may take the payload container 202 from the tray of the vehicle 212 and put the payload container 202 on a tray of the vehicle 208. After the payload container 202 is transferred directly from the vehicle 212 to the vehicle 208, the vehicle 208 continues traveling along the overhead track 207 until carrying the payload container 202 to the target position in the FAB 102. The cross-fab transfer process is thus finished without arranging an interface device (e.g., stocker) between the OHT system 206 and the OHT system 209 to temporarily hold the payload container (e.g., FOUP) 202 (shown in FIG. 2A). As such, the effective area that may be used to place process tools may be increased. Since the cross-fab transfer process is simplified by reducing processes such as temporality positioning the payload container 202 on the interface device and taking the payload container 202 from the same interface device, traffic jams caused by those processes may be advantageously reduced.

Figure 3:
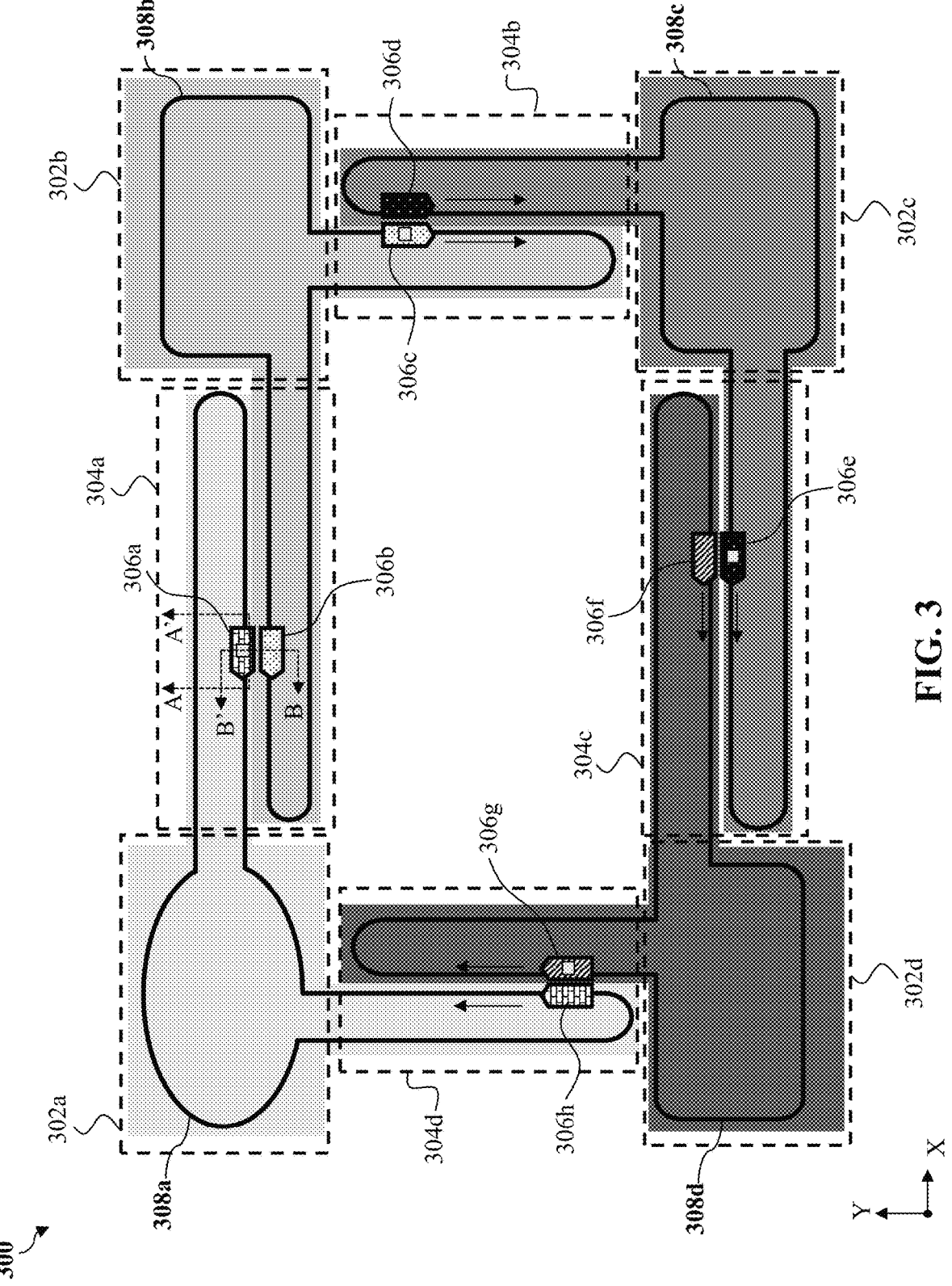
FIG. 3 illustrates a simplified fragmentary schematic diagram illustrating an alternative FAB cluster, according to one or more embodiments of the present disclosure.

FIG. 3 illustrates a simplified fragmentary schematic diagram illustrating a cross-fab transfer process in an alternative FAB cluster 300, according to one or more embodiments of the present disclosure. A block diagram of the FAB cluster 300 is similar to the FAB cluster 100, and one of the differences between the FAB cluster 300 and the FAB cluster 100 is that the FAB cluster 300 includes more FABs and more bridging areas. Equipment in each FAB is omitted for reason of simplicity. Each FAB in the FAB cluster 300 may be in communication with the unified control unit 126. In the present embodiments, as depicted in FIG. 3, the FAB cluster 300 includes a FAB 302a, a FAB 302b, a FAB 302c, and a FAB 302d. The FAB 302a and FAB 302b are connected by a bridging area 304a, the FAB 302b and FAB 302c are connected by a bridging area 304b, the FAB 302c and FAB 302d are connected by a bridging area 304c, and the FAB 302d and FAB 302a are connected by a bridging area 304d. Each of the FABs 302a-302d may include a building. Each of the bridging areas 304a-304d may be a corridor bridge or a skyway bridge, for example. In some embodiments, the FABs 302a-302d and the bridging areas 304a-304d have substantially same clean room levels. In some other embodiments, the FABs 302a-302d and the bridging areas 304a-304d may have different clean room levels, and when a payload container is to be transferred from a FAB having a lower clean room level to a FAB having a higher clean room level, a physical cleaning process (e.g., deionized water by shower) may be performed to clean the vehicle and the payload container. Each of the FABs 302a-302d has its own OHT tracks 308a, 308b, 308c, and 308d, respectively. In the present embodiments, besides located inside its respective FAB, each of the OHT tracks has two other portions in two different bridging areas. For example, the OHT tracks 308a have a portion in the FAB 302a, a portion in the bridging area 304a, and a portion in the bridging area 304d.

The FABs 302a-302d are configured to conduct different fabrication steps. In an embodiment, the FAB 302a includes process tools that are configured to perform advanced processes. For example, front-end-of-line (FEOL) processes that generally encompasses processes related to fabricating integrated circuit (IC) devices, such as transistors (e.g., gate-all-around transistors, fin field-effect transistors (Fin-FETs), complementary field-effect transistors (CFETs)), and/or middle-end-of-line (MEOL) processes that generally encompasses processes related to fabricating contacts to conductive features of the IC devices, such as gate vias to gate structures and/or source/drain contacts to source/drain features are performed by process tools in the FAB 302a. The process tools in the FAB 302a may include extreme ultraviolet (EUV) lithography system(s), chemical vapor deposition (CVD) tool(s), atomic layer deposition (ALD) tool(s), and other suitable tools.

In some embodiments, after performing some or all of the FEOL processes and/or MEOL processes in the FAB 302a, processed wafers may be transferred to other FABs (e.g., the FAB 302b, the FAB 302c, and/or the FAB 302d) for further processing. In an embodiment, the FAB 302b includes process tools that are configured to perform back-end-of-line (BEOL) processes that generally encompasses processes related to fabricating a multilayer interconnect (MLI) structure that interconnects IC features fabricated by FEOL and MEOL process, thereby enabling operation of the IC devices. The process tools in the FAB 302b may include chemical vapor deposition (CVD) tools, etching tools, and other suitable tools. In an embodiment, the process tools in the FAB 302b doesn't include extreme ultraviolet (EUV) lithography system(s). To transfer the IC devices formed in the FAB 302a to the FAB 302b, the FAB 302a and the FAB 302b may communicate with the unified control unit 126. Cross-fab transfer between the FAB 302a and the FAB 302b is similar to that described above with respect to FAB s 102 and 104. In some embodiments, to ensure that there are enough payload containers in the FAB 302a, vehicles of the FAB 302a may not only send payload containers that contain payloads to vehicles of the FAB 302b, but also receive unoccupied/empty payload containers from vehicles of the FAB 302b. Payload containers transferred between the FAB 302a and the FAB 302b may include FOUP, FOSB, or reticle container. Vehicles in the FAB 302a and FAB 302b are configured to be compatible with all those different types of payload containers.

In some embodiments, after performing some or all of the BEOL processes in the FAB 302b, IC devices may be transferred from the FAB 302b to other FAB s (e.g., the FAB 302c and/or the FAB 302d) for further processing. In an embodiment, the FAB 302c includes process tools that are configured to perform dicing, wafer bonding, wiring, molding, and/or other packaging processes. The process of wafer dicing enables manufacturers of integrated circuits (ICs) and other semiconductor devices to harvest many individual dice from a single wafer. The process tools in the FAB 302c may include wafer dicing machine(s), wire bonding machine(s), die attach machine(s), molding equipment for encapsulating integrated circuits, and/or other suitable equipment. In an embodiment, the process tools in the FAB 302c doesn't include chemical vapor deposition (CVD) tools, etching tools, extreme ultraviolet (EUV) lithography system(s). To transfer the IC devices formed in the FAB 302b to the FAB 302c, the FAB 302b and the FAB 302c may communicate with the unified control unit 126. Cross-fab transfer between the FAB 302b and the FAB 302c is similar to that described above with respect to FAB s 102 and 104. In some embodiments, vehicles of the FAB 302b may not only send payload containers that contain payloads to vehicles of the FAB 302c, but also receive unoccupied payload containers from vehicles of the FAB 302c. Payload containers transferred between the FAB 302b and the FAB 302c may include FOUP, reticle container, tray cassette, frame cassette, magazine cassette, and/or other suitable payload containers. Vehicles in the FAB 302b and FAB 302c are configured to be compatible with all those different types of payload containers.

In some embodiments, after performing some or all of the packaging processes in the FAB 302c, the packaged IC devices may be transferred from the FAB 302c to the FAB 302d for testing to determine if the packaged IC devices work properly. In an embodiment, the FAB 302d includes process tools that are configured to perform testing for, for example, electrical and functional characteristics as well as performance of the packaged IC devices to detect defects. The process tools in the FAB 302d may include automated test equipment (ATE), wafer prober, probe card, and/or other suitable testing tools. In an embodiment, the process tools in the FAB 302d doesn't include chemical vapor deposition (CVD) tools, etching tools, photolithography system(s), wafer dicing machine(s), wire bonding machine(s), die attach machine(s), or molding equipment. To transfer the packaged IC devices formed in the FAB 302c to the FAB 302d, the FAB 302c and the FAB 302d may communicate with the unified control unit 126. Cross-fab transfer between the FAB 302c and the FAB 302d is similar to that described above with respect to FAB s 102 and 104. In some embodiments, vehicles of the FAB 302c may not only send payload containers that contain payloads to vehicles of the FAB 302d, but also receive unoccupied payload containers from vehicles of the FAB 302d. Payload containers transferred between the FAB 302c and the FAB 302d may include FOUP, tray cassette, or other suitable payload containers. Vehicles in the FAB 302c and FAB 302d are configured to be compatible with all those different types of payload containers.

In some other embodiments, after performing some or all of the FEOL processes and/or MEOL processes in the FAB 302a, instead of transferring the processed wafers to the FAB 302b, the processed wafers may be transferred by vehicles 306g and 306h to the FAB 302d for testing. In some embodiments, after performing some or all of the BEOL processes in the FAB 302b, the processed wafers may be transferred to the FAB 302d for testing before packing. In some embodiments, after some processes in the FAB 302c are performed, the wafers may also be transferred to the FAB 302d for testing, and the tested wafers may be then transfer from the FAB 302d to the FAB 302c to finish the rest of the processes in the FAB 302c.

FIG. 4 depicts a flow chart illustrating an exemplary method 400 of performing the cross-fab transfer process in the FAB cluster 300 in FIG. 3. In an embodiment, the method 400 includes, at block 402, sending a signal to a unified control unit (e.g., unified control unit 126) once processes (e.g., FEOL and/or MEOL processes) that should be performed in a first FAB (e.g., FAB 302a in FIG. 3) are finished and a payload (e.g., wafers) is ready for next steps that will be performed in a second FAB (e.g., FAB 302b in FIG. 3). In some embodiments, the signal may be sent by the FAB 302*a*. In some embodiments, after receiving the signal, the unified control unit 126 may determine an appropriate route for transferring the payload between its current position in the FAB 302*a* and its next position in the FAB 302*b*.

The method 400 also includes, at block 404, receiving, by the FAB 302*a* and the FAB 302*b*, respectively, an instruction from the unified control unit 126 to transfer the payload from the FAB 302*a* to the FAB 302*b*. The instruction may include a first sub-route comprised of transfers within the FAB 302*a* and transfers across the bridging area 304*a* and received by the MCS of the FAB 302*a* and a second sub-route comprised of transfers within the FAB 302*b* and transfers across the bridging area 304*a* and received by the MCS of the FAB 302*b*.

The method 400 also includes, at block 406, configuring (e.g., by MCS of the FAB 302*a*) a vehicle (e.g., vehicle 306*a*) of the FAB 302*a* to take the payload from the payload's current position to a bridging area (e.g., bridging area 304*a*) that connects the FAB 302*a* and 302*b* and transfer the payload to a corresponding vehicle (e.g., vehicle 306*b*) of the FAB 302*b* when appropriate, and, at block 408, configuring (e.g., by MCS of the FAB 302*b*) the corresponding vehicle (e.g., vehicle 306*b*) of the FAB 302*b* to arrive at the bridging area (e.g., bridging area 304*a*) and take the payload from the vehicle (e.g., vehicle 306*a*) of the FAB 302*a* when appropriate (e.g., when the two vehicles 306*a* and 306*b* are aligned, travelling along a same direction at a same speed and travelling on adjacent and parallel portions of OHT tracks, as described with reference to FIGS. 2A-2B).

The method 400 also includes, at block 410, conducting the payload transfer between vehicle 306*a* of the FAB 302*a* and vehicle 306*b* of the FAB 302*b* when some predetermined conditions (e.g., the two vehicles are aligned, travelling along a same direction at a same speed and travelling on adjacent and parallel portions of OHT tracks) are met. The payload transfer between the two vehicles is similar to that described above with respect to FIGS. 2A-2B. After the payload is received by the vehicle 306*b*, the vehicle 306*b* may carry the payload and deliver it to a predetermined equipment (e.g., a process tool or a stocker). The payload may then undergo some fabrication processes in the FAB 302*b*. Interbay and/or intrabay payload transfer processes may be further conducted inside the FAB 302*b*.

The method 400 includes, at block 412, sending a signal to the unified control unit (e.g., unified control unit 126) once processes (e.g., BEOL processes) that should be performed in the FAB 302*b* are finished and the payload is ready for next steps that will be performed in FAB 302*c*. In some embodiments, the signal may be sent by the FAB 302*b*. The signal may also be a manual request. In some embodiments, after receiving the signal, the unified control unit 126 may determine an appropriate route for transferring the payload between its current position in the FAB 302*b* and its desired next position in the FAB 302*c*.

The method 400 also includes, at block 414, receiving, by the FAB 302*b* and the FAB 302*c*, respectively, an instruction from the unified control unit 126 to transfer the payload from the FAB 302*b* to the FAB 302*c*. The method 400 also includes, at block 416, configuring (e.g., by MCS of the FAB 302*b*) a vehicle (e.g., vehicle 306*c*) of the FAB 302*b* to take the payload from the payload's current position to a bridging area (e.g., bridging area 304*b*) that connects the FAB 302*b* and the FAB 302*c* and transfer the payload to a corresponding vehicle (e.g., vehicle 306*d*) of the FAB 302*c* when appropriate, and, at block 418, configuring (e.g., by MCS of the FAB 302*c*) the corresponding vehicle (e.g., vehicle 306*d*) of the FAB 302*c* to arrive at the bridging area (e.g., bridging area 304*b*) and take the payload from the vehicle (e.g., vehicle 306*c*) of the FAB 302*b* when appropriate (e.g., when the two vehicles 306*c* and 306*d* are aligned, travelling along a same direction at a same speed and travelling on adjacent and parallel portions of OHT tracks, as described with reference to FIGS. 2A-2B).

The method 400 also includes, at block 420, conducting the payload transfer between vehicle 306*c* of the FAB 302*b* and vehicle 306*d* of the FAB 302*c*. The payload transfer between the two vehicles is similar to that described above with respect to FIGS. 2A-2B. After the payload is received by the vehicle 306*d*, the vehicle 306*d* may carry the payload and deliver it to a predetermined equipment (e.g., a process tool or a stocker). The payload may then undergo some fabrication processes (e.g., dicing, wire bonding) in the FAB 302*c*. Interbay and/or intrabay payload transfer processes may be further conducted inside the FAB 302*c*.

The method 400 includes, at block 422, sending a signal to the unified control unit (e.g., unified control unit 126) once processes that should be performed in the FAB 302*c* are finished and the payload is ready for next steps that will be performed in FAB 302*d*. In some embodiments, the signal may be sent by the FAB 302*c*. The signal may also be a manual request. In some embodiments, after receiving the signal, the unified control unit 126 may determine an appropriate route for transferring the payload between its current position in the FAB 302*c* and its desired next position in the FAB 302*d*.

The method 400 also includes, at block 424, receiving, by the FAB 302*c* and the FAB 302*d*, respectively, an instruction from the unified control unit 126 to transfer the payload from the FAB 302*c* to the FAB 302*d*. The method 400 also includes, at block 426, configuring (e.g., by MCS of the FAB 302*c*) a vehicle (e.g., vehicle 306*e*) of the FAB 302*c* to take the payload from the payload's current position to a bridging area (e.g., bridging area 304*c*) that connects the FAB 302*c* and 302*d* and transfer the payload to a corresponding vehicle (e.g., vehicle 306*f*) of the FAB 302*d* when appropriate, and, at block 428, configuring (e.g., by MCS of the FAB 302*d*) the corresponding vehicle (e.g., vehicle 306*f* of the FAB 302*d* to arrive at the bridging area (e.g., bridging area 304*c*) and take the payload from the vehicle (e.g., vehicle 306*e*) of the FAB 302*c* when appropriate (e.g., when the two vehicles 306*e* and 306*f* are aligned, travelling along a same direction at a same speed and travelling on adjacent and parallel portions of OHT tracks, as described with reference to FIGS. 2A-2B).

The method 400 also includes, at block 430, conducting the payload transfer between vehicle 306*e* of the FAB 302*c* and vehicle 306*f* of the FAB 302*d*. The payload transfer between the two vehicles is similar to that described above with respect to FIGS. 2A-2B. After the payload is received by the vehicle 306*f*, the vehicle 306*f* may carry the payload and deliver it to a predetermined equipment (e.g., a process tool or a stocker). The payload may undergo some fabrication processes in the FAB 302*d*. Interbay and/or intrabay payload transfer processes may be further conducted in the FAB 302*d*. In the above embodiments, payload (e.g., wafer) transfers are performed between FAB 302*a* and FAB 302*b*, between FAB 302*b* and FAB 302*c*, and between FAB 302*c* and FAB 302*d* in a sequential order. In some alternative embodiments, multiple cross-fab transfers may be performed simultaneously among those FABs, and various types of payloads may be transferred. In some other alternative embodiments, the payload may be transferred directly between the FAB 302a and the FAB 302d. Similar operations may be performed, and related description is omitted for reason of simplicity.

Figure 5:
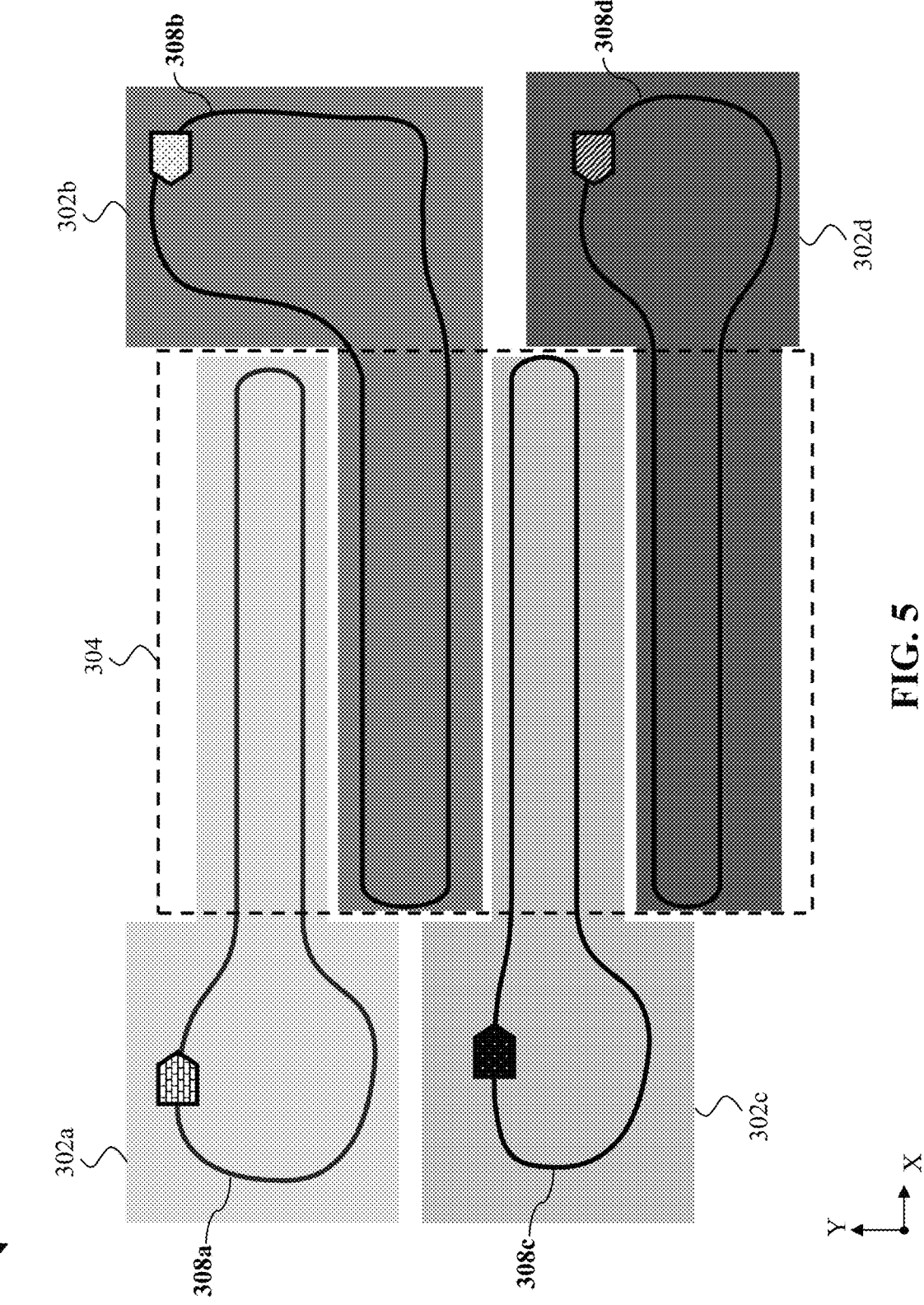
FIG. 5 illustrates a simplified fragmentary schematic diagram illustrating another alternative FAB cluster, according to one or more embodiments of the present disclosure.

FIG. 5 illustrates a simplified fragmentary schematic diagram of an alternative FAB cluster 300'. The FAB cluster 300' is similar to the FAB cluster 300. One of the differences between the FAB cluster 300' and the FAB cluster 300 is that the FABs 302a-302d in the FAB cluster 300' are arranged in a different way. More specifically, the FABs 302a-302d in the FAB cluster 300' are connected by a bridging area 304. Each of the OHT system of the FABs 302a-302d includes a portion of its OHT track in the bridging area 304. Two adjacent portions of the OHT tracks are at least partially parallel to enable the cross-fab transfer described above with reference to FIGS. 2A-2B. Repeated description is omitted for reason of simplicity.

Figure 6A:
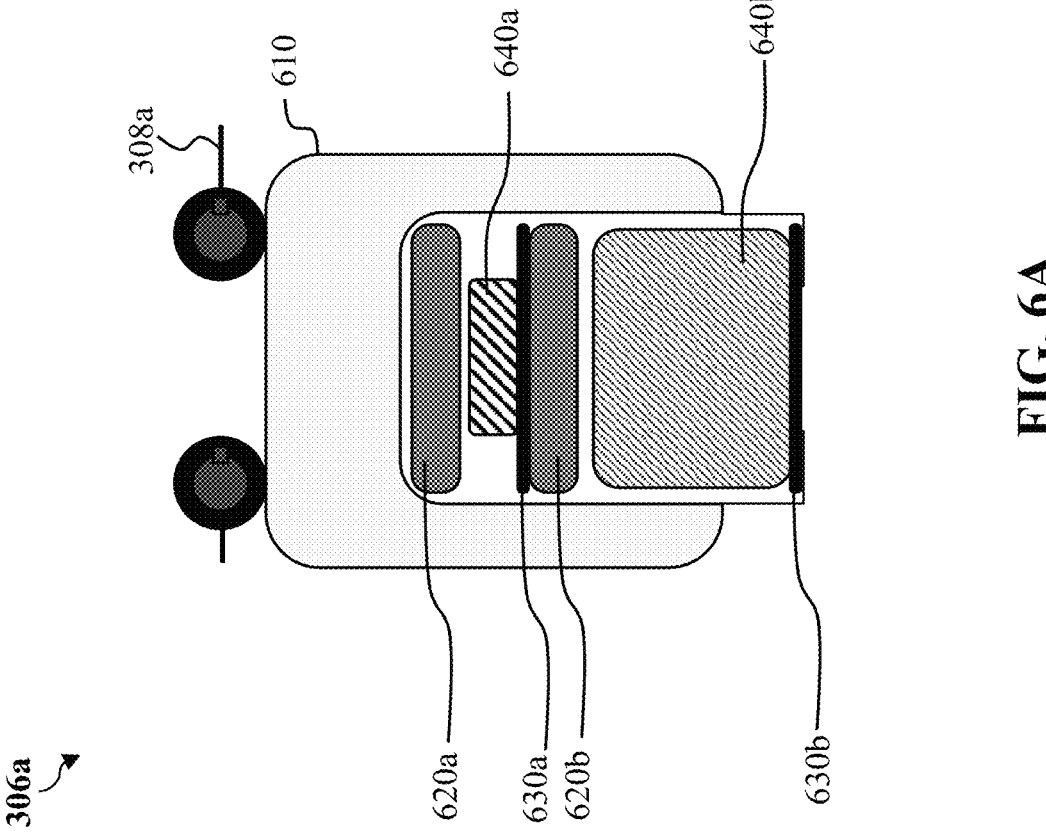
FIG. 6A depicts an exemplary vehicle, according to one or more embodiments of the present disclosure.

In the above embodiments described with reference to FIGS. 1-5, the cross-fab transfer may be performed without placing payloads on interface devices (e.g., stocker), thereby increasing transportation efficiency and reducing traffic jams. In some other embodiments represented in FIGS. 6A-6B, vehicles used in the OHT system(s) of the FAB(s) are able to take more than one payload containers to increase transportation efficiency and reduce traffic jams. FIG. 6A depicts a cross-sectional view of an exemplary vehicle taken along line A-A' as shown in FIG. 3, according to one or more embodiments of the present disclosure. FIG. 6B depicts a cross-sectional view of exemplary vehicles taken along line B-B' as shown in FIG. 3. Referring to FIG. 6A, the vehicle 306a is connected to the tracks 308a of the OHT system of the FAB 302a such that the vehicle 306a may be operable to move along the tracks 308a. The vehicle 306a includes a housing (or a main body) 610 and at least one (e.g., one, two, or more) upper gripper 620a and at least one (e.g., one, two, or more) lower gripper 620b configured to extend from the housing 610 to grab one or more payload containers from the process tool, interface equipment, another vehicle (such as vehicle 306b), and/or other devices. The upper gripper 620a and the lower gripper 620b may be mechanically coupled to an outer surface of the housing 610 or an inner surface of the housing 610. In an example, when the vehicle 306a is configured to take a payload container from an interface device, the upper gripper 620a or the lower gripper 620b may extend laterally (e.g., along the Y direction) and then vertically (along the –Z direction) to grab the payload container. The upper gripper 620a and the lower gripper 620b may perform their respective function independently. For example, in some embodiments, to take a payload container, only one of the upper gripper 620a and the lower gripper 620b is configured to operate to take the payload container.

The vehicle 306a also includes a first tray 630a configured to hold or carry a payload container grabbed by the upper gripper 620a and a second tray 630b configured to hold or carry a payload container grabbed by the lower gripper 620b. For example, after the upper gripper 620a takes a reticle container from an equipment in the FAB 302a, the upper gripper 620a may put the reticle container on the first tray 630a. During the cross-fab transfer process, the first tray 630a may be operable to slide out from the main body 610 of the vehicle 306a to facilitate the transfer process. Similarly, after the lower gripper 620b takes a FOUP from an equipment in the FAB 302a, the lower gripper 620b may put the FOUP on the second tray 630b. The second tray 630b may be operable to slide out from the main body 610 of the vehicle 306a during the cross-fab transfer process. In some embodiments, to prevent the payload carrier from being dropped out from the tray (e.g., the first tray 630a, the second tray 630b), the tray may be configured to have anti-skid mechanisms. In an embodiment, dampers may be installed on the top surface of the tray.

The first tray 630a and sidewall and top surfaces of the housing 610 form an upper cavity. The second tray 630b, sidewall surfaces of the housing 610, and a bottom surface of the first tray 630a form a lower cavity. In some embodiments, a volume of the upper cavity is less than a volume of the lower cavity, and the first tray 630a and second tray 630b are configured to hold payload containers with different volumes. For example, the first tray 630a may hold a payload container 640a (e.g., tray cassette or reticle container) having a volume smaller than that of a payload container 640b (e.g., FOUP or FOSB) held by the second tray 630b. By providing vehicles capable to carry more than one payload containers, more payload containers may be transferred and/or less vehicles are needed, thereby increasing transportation efficiency and reducing traffic jams. In addition, instead of using a stocker to temporarily hold the payload container, temporarily storing the payload container on one of the trays of the vehicle may reduce the time spent on unloading the payload container. Advantageously, less clean room space is needed in order to arrange interface devices (e.g., stockers) to implement the cross-fab transfer.

FIG. 6B illustrates a simplified schematic diagram of the vehicle 306a and vehicle 306b during the cross-fab transfer process. The vehicles 306a-306h and vehicles 208-210 have substantially the same structure, and repeated description related to the structure of the vehicle 306b is omitted for reason of simplicity. In this illustrated example, the first tray 630a of the vehicle 306a holds the payload container 640a and the second tray 630b of the vehicle 306a holds the payload container 640b. After the vehicle 306a and vehicle 306b are ready for payload transfer, upper gripper 620a' and lower gripper 620b' of the vehicle 306b extend out from the vehicle 306b's main body and then extend laterally and/or vertically. The first tray 630a and the second tray 630b of the vehicle 306a may slide out from the vehicle 306a's main body 610. The upper gripper 620a' and lower gripper 620b' of the vehicle 306b may then extend downwardly to take and lift the payload container 640a and the payload container 640b, respectively, from the first tray 630a and the second tray 630b of the vehicle 306a and put the payload container 640a and the payload container 640b on the first tray 630a' and the second tray 630b' of the vehicle 306b, respectively. In some other embodiments, the payload container 640a may be transferred from the vehicle 306a to the vehicle 306b, and the payload container 640b may be transferred from the vehicle 306a to another vehicle. That is, destinations of the payload container 640a and payload container 640b may be same or different. In some other embodiments, the vehicle 306a may hold a payload container with payload inside, and the vehicle 306b may hold an empty payload container. After the vehicle 306a and the vehicle 306b are aligned and are ready for transfer, the vehicle 306a may take the empty payload container from the vehicle 306b, and the vehicle 306b may receive the occupied payload container from the vehicle 306a. In some other embodiments, the vehicle may contain two empty payload containers. The vehicles that are able to carry two payload containers may be used in the FABs 102-104 and/or FABs 302a-302d for cross-fab transfers, cross-phase transfers in a same FAB, and/or cross-AMHS transfers.

FIG. 7 depicts a flow chart illustrating an exemplary method 700 of conducting the cross-fab transfer process by the vehicles 306a and 306b, according to one or more embodiments of the present disclosure. The method 700 includes, at block 702, receiving, by a vehicle (e.g., vehicle 306*a*), an instruction to take a first payload container (e.g., payload container 640*a*) in a first FAB (e.g., FAB 302*a*), transfer the payload container 640*a* to a vehicle (e.g., vehicle 306*b*) of another FAB (e.g., FAB 302*b*), and receive a second payload container from the vehicle 306*b*. The method 700 includes, at block 704, travelling along rails 308*a* of the FAB 302*a* until arriving the current position of the payload container 640*a*. The payload container 640*a* may carry payloads, such as wafers or reticles. The method 700 includes, at block 706, grabbing, by a gripper (e.g., the upper gripper 620*a*) of the vehicle 306*a*, the payload container 640*a* and placing it on the corresponding tray (e.g., the first tray 630*a*). The method 700 includes, at block 708, travelling along rails 308*a* of the FAB 302*a* and arriving a predetermined location of the bridging area between the two FAB s (e.g., bridging area 304*a*) at a predetermined time.

The method 700 also includes, at block 710, receiving, by a vehicle (e.g., vehicle 306*b*), an instruction to take a second payload container (not shown) in a second FAB (e.g., FAB 302*b*), transfer the second payload container to a vehicle (e.g., vehicle 306*a*) of the first FAB (e.g., FAB 302*a*), and receive the first payload container (e.g., payload container 640*a*) from the vehicle 306*a*. The method 700 includes, at block 712, travelling along rails 308*b* of the FAB 302*b* until arriving the current position of the second payload container. The second payload container in the FAB 302*b* that will be transferred to FAB 302*a* may be an empty payload container without carrying payloads. The method 700 includes, at block 714, grabbing, by gripper (e.g., the lower gripper 620*b*) of the vehicle 306*b*, the empty payload container and placing it on the corresponding tray (e.g., the second tray 630*b*). The method 700 includes, at block 716, travelling along rails 308*b* of the FAB 302*b* and arriving a corresponding predetermined location of the bridging area 304*a* at a predetermined time. Then, as represented by block 718 of method 700, the vehicle 306*a* and vehicle 306*b* may then start alignment process and determine whether the vehicle 306*a* and vehicle 306*b* are ready for transfer (e.g., whether the first and second vehicles 306*a*-306*b* are aligned, moving along a same direction at a same speed). If not, the vehicle 306*a* and vehicle 306*b* may configure their respective speed or perform other operations until they are ready for transfer. If yes, the method 700 moves to block 720 where the empty payload container is transferred from the vehicle 306*b* to the vehicle 306*a*, and the payload container 640*a* is transferred from the vehicle 306*a* to the vehicle 306*b*. The two transfers may be performed simultaneously. It is understood that the vehicle 306*a* and vehicle 306*b* may perform fewer or greater operations as would be apparent to one skilled in the art.

Figure 8:
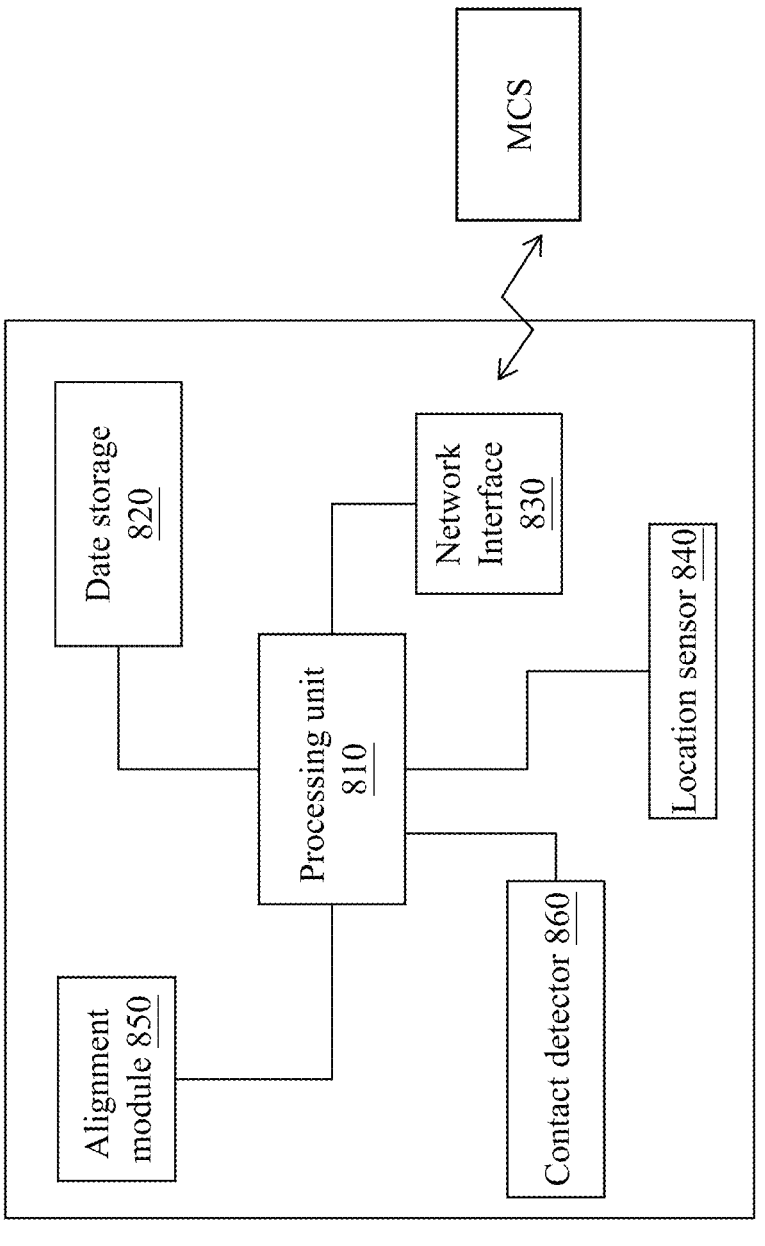
FIG. 8 depicts a block diagram of a control system of the vehicle, according to one or more embodiments of the present disclosure.

FIG. 8 depicts a block diagram of a control system of the vehicle 306*a*, according to one embodiment of the present disclosure. In the present embodiments, the vehicle 306*a* includes a processing unit 810 configured to perform operations to execute the cross-fab transfer. For example, the processing unit 810 may determine the operation of the grippers 620*a* and 620*b* and the operations of the trays 630*a* and 630*b*. The processing unit 810 is coupled to data storage (e.g., a non-volatile memory (NVM)) 820. The data storage 820 may store instructions that, when executed by the processing unit 810, cause the processing unit 810 to perform operations to control the movement and speed of the vehicle, the operation of the grippers, the movement of the trays, for example. The data storage 820 may also include look-up tables (LUTs) to store one or more parameters/operations associated with one or more predetermined criteria. The predetermined criteria may include criteria corresponding to, for example, monitored or detected status parameters. The vehicle 306*a* also includes a network interface 830 coupled to the processing unit 810 to provide interconnection between the vehicle 306*a* and the MCS of the FAB 302*a*. The processing unit 810 may transmit, via the network interface 830, information such as location and the trays' availability statuses of the vehicle to the MCS. The processing unit 810 may receive, via the network interface 830, signals such as sub-route requests.

The vehicle 306*a* also includes a location sensor 840 operably connected to the processing unit 810. During operation, the location sensor 840 may provide location information of the vehicle 306*a* to the processing unit 810. Based on the location information, the processing unit 810 may perform different operations. The vehicle 306*a* also includes an alignment module 850 coupled to the processing unit 810 to determine whether the vehicle 306*a* is aligned with the predetermined object (e.g., the vehicle 306*b*). In some embodiments, the alignment module 850 may include an image sensor, a laser sensor, a tilt-angle sensor, other suitable devices, and/or combinations thereof. In some embodiments, the vehicle 306*a* may also include a contact detector 860 configured to determine whether the gripper(s) of the vehicle is in full contact with the payload carrier. It is understood that the vehicle 306*a* may have fewer or greater components as would be apparent to one skilled in the art. For example, the vehicle 306*a* may include a display that may be configured to show a bar code, an image, a QR code or other suitable information such that the other vehicle may use alignment module to detect or scan the information ("alignment mark") shown on the display to determine the alignment between these two vehicles.

In the above embodiments described with reference to FIGS. 1-8, operations performed by vehicles of the FAB are controlled by the MCS of the FAB, no matter whether the vehicles are travelling along rails in the FAB or in the bridging areas. In some other embodiments, once the vehicles entering into the bridging area, another MCS may take the responsibility to control operations that will be performed by the vehicles.

FIG. 9 illustrates a block diagram of a simplified FAB cluster 900, according to one embodiment of the present disclosure. The FAB cluster 900 is similar to the FAB cluster 100. One of the differences between the FAB cluster 900 and the FAB cluster 100 is that the bridging area 106 of the FAB cluster 900 includes an MCS 113. An exemplary process for cross-fab transfer in the FAB cluster 900 includes, receiving an instruction, by the vehicle 212 (shown in FIG. 2A), to take the payload container 202 from an equipment in the FAB 104 and transfer the payload container 202 to the vehicle 208 when the vehicle 212 is moving along the portion 210*b*. In some embodiments, the instruction may include one of the sub-route requests received from the microprocessor 130. After receiving the instruction, the vehicle 212 is configured to move along the track 210 of the OHT system 209 to arrive at a location that is in proximity of the equipment that is holding the payload container 202. The vehicle 212 is then configured to grab the payload container 202 from the equipment and carry the payload container 202. After taking the payload container 202, the vehicle 212 is configured to move along the track 210 and arrive at the predetermined location 214. In some embodiments, one or more sensors may be installed near the boundary of the FAB 104 to detect for the entry/exit of the vehicles 212. Once the sensors detected the exit of the vehicle 212, a signal may be sent to the MCS 116 of the FAB 104 and the MCS 113 of the bridging area 106, and the MCS 113 of the bridging area 106 may then have the control of the vehicle 212. Similarly, once sensors detected the exit of the vehicle 208 of the FAB 102, the MCS 113 of the bridging area 106 may then have the control of the vehicle 208. The MCS 113 of the bridging area 106 may instruct the vehicle 212 and vehicle 208 to perform operations to perform the payload transfer at the bridging area 106.

Figure 10:
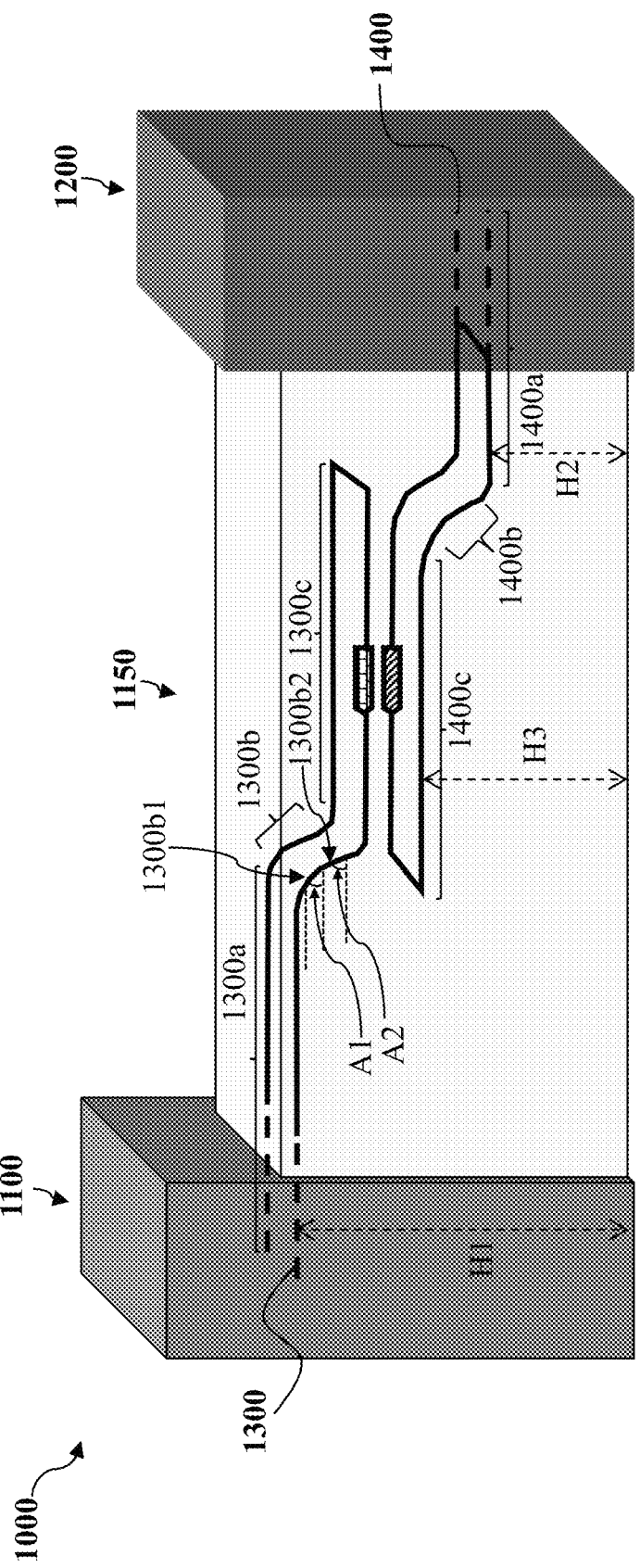
FIG. 10 is a simplified fragmentary schematic diagram of another FAB cluster, according to another embodiment of the present disclosure.

FIG. 10 is a simplified fragmentary perspective view of a FAB cluster 1000. In some semiconductor FAB clusters, each FAB may have one building configured to contain different equipment, and different FAB s may have different heights. That is, a height of OHT tracks of a first FAB may be different from a height of OHT tracks of a second FAB. To conduct cross-fab transportation using the methods described above with reference to FIGS. 1-9, configurations of the OHT tracks of the first and second FAB s may be improved. FIG. 10 depicts an example of improved OHT tracks to facilitate efficient cross-fab transportation. As depicted in FIG. 10, the first FAB 1100 has OHT tracks 1300 in the first FAB 1100 and in a bridging area 1150, the second FAB 1200 has OHT tracks 1400 in the second FAB 1200 and in the bridging area 1150. A height H1 of the portion of OHT tracks 1300 in the first FAB 1100 is different than a height H2 of the portion of OHT tracks 1400 in the second FAB 1200. To perform efficient cross-fab transportation in the bridging area 1150, each of the OHT tracks 1300 and 1400 is configured to such that at least a portion of the OHT tracks 1300 and a portion of the OHT tracks 1400 are parallel and have a same height in the bridging area 1150. In the present embodiments, the portion of the OHT tracks 1300 of the first FAB 1100 has three parts: a first part 1300a that has a height H1 in the first FAB 1100, a second part 1300b having a slanted rail and thus non-uniform heights in the bridging area 1150, and a third part 1300c in the bridging area 1150 and having a height H3 less than the height H1. Similarly, the portion of the OHT tracks 1400 of the second FAB 1200 has three parts: a first part 1400a that has a height H2 in the second FAB 1200, a second part 1400b having a slanted rail and thus non-uniform heights in the bridging area 1150, and a third part 1400c in the bridging area 1150 and having the height H3 greater than the height H2. To ensure payload carriers held by the vehicles may maintain stability along the second parts 1300b and 1400b, in every meter, an angle difference between an angle A1 of a first piece 1300b1 of the second part 1300b and an angle A2 of a second piece 1300b2 neighboring the first piece 1300b1 of the second part 1300b is less than 10°. If the angle difference is greater than 10°, payload carrier may fall down from the vehicle. If the angle difference is less than 10°, the bridging area may not be able to contain the long OHT tracks. This applies to the second parts 1400b of the OHT tracks 1400 of the second FAB 1200 as well. By configuring the heights of the OHT tracks 1300 and OHT tracks 1400, vehicles from the two FAB s may be aligned while travelling along the third parts 1300c and 1400c of the OHT tracks, and cross-fab transportation may be performed efficiently using the methods described above.

Although not intended to be limiting, one or more embodiments of the present disclosure provide many benefits to a cross-fab transfer. For example, the present disclosure provides a method for performing a cross-fab transfer without putting a payload carrier temporarily on a stocker or other interface devices. As such, the cross-fab transfer is simplified. In addition, the manufacturing facility doesn't need interface devices arranged in a bridging area. Also, the traffic jam caused by temporarily putting the wafer carrier on the interface devices and then taking the wafer carrier from the interface devices may be reduced. In some embodiments, vehicles of the FAB(s) may be operable to contain one or more (e.g., two) payload containers to further increase transportation efficiency and reduce traffic jams. One or more embodiments of the present disclosure may also be applied in a cross-phase transportation, a cross-AMHS transportation.

The present disclosure provides for many different embodiments. Semiconductor systems and thereof are disclosed herein. In one exemplary aspect, the present disclosure is directed to a system. The system includes a first fabrication plant (FAB) building including a first set of fabrication tools, a first overhead transfer (OHT) track servicing the first set of fabrication tools, and a first vehicle operable to carry a first container and move along the first OHT track. The system also includes a second FAB building including a second set of fabrication tools, a second OHT track servicing the second set of fabrication tools, and a second vehicle operable to carry the first container and move along the second OHT track. The system also includes a first bridging area between the first FAB building and the second FAB building, wherein the first OHT track comprises a first portion in the first FAB building and a second portion in the first bridging area, the second OHT track comprises a first portion in the second FAB building and a second portion in the first bridging area, the second portion of the second OHT track is at least partially in parallel with the second portion of the first OHT track, the second vehicle is operable to directly receive the first container from the first vehicle when both the first vehicle and the second vehicle are moving in the first bridging area.

In some embodiments, the first set of fabrication tools may be configured to perform front-end-of-line (FEOL) processes, and the second set of fabrication tools may be configured to perform back-end-of-line (BEOL) processes. In some embodiments, the first container may be configured to contain wafers or reticles. In some embodiments, the first container may include a front opening unified pod (FOUP), a front opening shipping box (FOSB), or a reticle container. In some embodiments, the system may also include a master control system configured to organize transportation of payloads between the first FAB building and the second FAB building, the first FAB building may also include a first control system configured to directly communicate with the first vehicle and the master control system, the second FAB building may also include a second control system configured to directly communicate with the second vehicle and the master control system. In some embodiments, the system may also include a third control system, where the first control system may be configured to control operations performed by the first vehicle when the first vehicle is moving along the first portion of the first OHT track, the second control system may be configured to control operations performed by the second vehicle when the second vehicle is moving along the first portion of the second OHT track, and the third control system may be configured to control operations performed by the first vehicle when the first vehicle is moving along the second portion of the first OHT track and control operations performed by the second vehicle when the second vehicle is moving along the second portion of the second OHT track. In some embodiments, the first vehicle may be operable to carry two containers simultaneously. In some embodiments, the first vehicle may be further operable to directly receive another container from the second vehicle when both the first vehicle and the second vehicle are moving in the first bridging area. In some embodiments, the system may also include a third FAB building including a third set of fabrication tools, a third OHT track servicing the third set of fabrication tools, and a third vehicle operable to carry the first container and move along the third OHT track. The system may also include a second bridging area between the second FAB building and the third FAB building, where the second OHT track may further include a third portion in the second bridging area, the third OHT track may include a first portion in the third FAB building and a second portion in the second bridging area, the third portion of the second OHT track is in parallel with the second portion of the third OHT track, and third vehicle may be operable to directly receive the first container from a vehicle of the second FAB building. In some embodiments, the third set of fabrication tools may be configured to perform processes comprises dicing, wiring, or molding. In some embodiments, a vehicle of the third FAB building may be operable to transfer an unoccupied container to a vehicle of the second FAB building. In some embodiments, a height of the first portion of the first OHT track in the first FAB building may be different than a height of the first portion of the second OHT track in the second FAB building.

In another exemplary aspect, the present disclosure is directed to a system. The system includes a first automatic material handling system (AMHS) comprising a first overhead transfer (OHT) track, and a first vehicle movable along the first OHT track, where the first vehicle is operable to carry a first payload container and a second payload container simultaneously.

In some embodiments, the first payload container may include a tray cassette or a reticle container. In some embodiments, the second payload container may include a front opening unified pod (FOUP) or a front opening shipping box (FOSB). In some embodiments, the system may also include a second AMHS comprising a second OHT track and a second vehicle movable along the second OHT track and operable to carry two payload containers simultaneously, where the first OHT track comprises a first portion that is in parallel with and adjacent to a second portion of the second OHT track, and on condition that the first vehicle is within the first portion of the first OHT track, and the second vehicle is within the second portion of the second OHT track, the first vehicle is operable to transfer at least one of the first payload container and the second payload container to the second vehicle. In some embodiments, the first vehicle may include a first gripper configured to grab the first payload container, a first container holder configured to hold the first payload container, a second gripper configured to grab the second payload container, and a second container holder configured to hold the second payload container, wherein the second container holder is disposed under the first container holder.

In yet another exemplary aspect, the present disclosure is directed to a method. The method includes providing a first FAB building and a second FAB building connected via a bridging area, wherein the first FAB building comprises a first set of fabrication tools configured to perform first plurality of fabrication processes, the second FAB building comprises a second set of fabrication tools configured to perform second plurality of fabrication processes, performing one or more fabrication processes of the first plurality of fabrication processes to a wafer in the first FAB building, configuring a first vehicle of the first FAB building to travel along a first overhead transfer (OHT) track and take the wafer to the bridging area, wherein a first portion of the first OHT track is at the bridging area, configuring a second vehicle of the second FAB building to travel along a second overhead transfer (OHT) track and arrive at the bridging area, wherein a second portion of the second OHT track is at the bridging area and in parallel with the first portion of the first OHT track, on condition that the first vehicle and the second vehicle are aligned and travelling at a same speed along a same direction along the first portion of the first OHT track and the second portion of the second OHT track, respectively, configuring the first vehicle to transfer the wafer to the second vehicle, and performing one or more fabrication processes of the second plurality of fabrication processes to the wafer in the second FAB building.

In some embodiments, the first plurality of fabrication processes may include front-end-of-line (FEOL) processes configured to form isolation features, gate structures, and source/drain features, the second plurality of fabrication processes may include back-end-of-line (BEOL) processes configured to form a multilayer interconnect (MLI) structure that interconnects integrated circuit features fabricated by FEOL process. In some embodiments, the method may also include, on condition that the first vehicle and the second vehicle are aligned and travelling at a same speed along a same direction along the first portion of the first OHT track and the second portion of the second OHT track, respectively, further configuring the second vehicle to transfer a payload container to the first vehicle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a first fabrication plant (FAB) building comprising:
      a first set of fabrication tools,
      a first overhead transfer (OHT) track servicing the first set of fabrication tools, and
      a first vehicle operable to carry a first container and move along the first OHT track;
   a second FAB building comprising:
      a second set of fabrication tools,
      a second OHT track servicing the second set of fabrication tools, and
      a second vehicle operable to carry the first container and move along the second OHT track; and
   a first bridging area between the first FAB building and the second FAB building, wherein the first OHT track comprises a first portion in the first FAB building and a second portion in the first bridging area, the second OHT track comprises a first portion in the second FAB building and a second portion in the first bridging area, the second portion of the second OHT track is at least partially in parallel with the second portion of the first OHT track,
   wherein, the second vehicle is operable to directly receive the first container from the first vehicle when both the first vehicle and the second vehicle are moving in the first bridging area.

2. The system of claim 1, wherein the first set of fabrication tools are configured to perform front-end-of-line (FEOL) processes, and the second set of fabrication tools are configured to perform back-end-of-line (BEOL) processes.

3. The system of claim 1, wherein the first container is configured to contain wafers or reticles.

4. The system of claim 1, wherein the first container comprises a front opening unified pod (FOUP), a front opening shipping box (FOSB), or a reticle container.

5. The system of claim 1, further comprising:
a master control system configured to organize transportation of payloads between the first FAB building and the second FAB building,
wherein the first FAB building further comprises a first control system configured to directly communicate with the first vehicle and the master control system, the second FAB building further comprises a second control system configured to directly communicate with the second vehicle and the master control system.

6. The system of claim 5, further comprising:
a third control system,
wherein, the first control system is configured to control operations performed by the first vehicle when the first vehicle is moving along the first portion of the first OHT track, the second control system is configured to control operations performed by the second vehicle when the second vehicle is moving along the first portion of the second OHT track, and the third control system is configured to control operations performed by the first vehicle when the first vehicle is moving along the second portion of the first OHT track and control operations performed by the second vehicle when the second vehicle is moving along the second portion of the second OHT track.

7. The system of claim 1,
wherein the first vehicle is operable to carry two containers simultaneously.

8. The system of claim 1, wherein the first vehicle is further operable to directly receive another container from the second vehicle when both the first vehicle and the second vehicle are moving in the first bridging area.

9. The system of claim 1, further comprising:
a third FAB building comprising:
a third set of fabrication tools,
a third OHT track servicing the third set of fabrication tools, and
a third vehicle operable to carry the first container and move along the third OHT track; and
a second bridging area between the second FAB building and the third FAB building, wherein the second OHT track further comprises a third portion in the second bridging area, the third OHT track comprises a first portion in the third FAB building and a second portion in the second bridging area, the third portion of the second OHT track is in parallel with the second portion of the third OHT track; and
wherein, the third vehicle is operable to directly receive the first container from a vehicle of the second FAB building.

10. The system of claim 9, wherein the third set of fabrication tools are configured to perform processes comprises dicing, wiring, or molding.

11. The system of claim 9, wherein a vehicle of the third FAB building is operable to transfer an unoccupied container to a vehicle of the second FAB building.

12. The system of claim 1, wherein a height of the first portion of the first OHT track in the first FAB building is different than a height of the first portion of the second OHT track in the second FAB building.

13. A system, comprising:
a first automatic material handling system (AMHS) comprising:
a first overhead transfer (OHT) track, and
a first vehicle movable along the first OHT track, wherein the first vehicle is operable to carry a first payload container and a second payload container simultaneously.

14. The system of claim 13, wherein the first payload container comprises a tray cassette or a reticle container.

15. The system of claim 13, wherein the second payload container comprises a front opening unified pod (FOUP) or a front opening shipping box (FOSB).

16. The system of claim 13, further comprising:
a second AMHS comprising:
a second OHT track, and
a second vehicle movable along the second OHT track and operable to carry two payload containers simultaneously,
wherein the first OHT track comprises a first portion that is in parallel with and adjacent to a second portion of the second OHT track,
wherein, on condition that the first vehicle is within the first portion of the first OHT track, and the second vehicle is within the second portion of the second OHT track, the first vehicle is operable to transfer at least one of the first payload container and the payload second container to the second vehicle.

17. The system of claim 13, wherein the first vehicle comprises:
a first gripper configured to grab the first payload container;
a first container holder configured to hold the first payload container;
a second gripper configured to grab the second payload container; and
a second container holder configured to hold the second payload container, wherein the second container holder is disposed under the first container holder.

18. A method, comprising:
providing a first FAB building and a second FAB building connected via a bridging area, wherein the first FAB building comprises a first set of fabrication tools configured to perform first plurality of fabrication processes, the second FAB building comprises a second set of fabrication tools configured to perform second plurality of fabrication processes;
performing one or more fabrication processes of the first plurality of fabrication processes to a wafer in the first FAB building;
configuring a first vehicle of the first FAB building to travel along a first overhead transfer (OHT) track and take the wafer to the bridging area, wherein a first portion of the first OHT is at the bridging area;
configuring a second vehicle of the second FAB building to travel along a second overhead transfer (OHT) track and arrive at the bridging area, wherein a second portion of the second OHT is at the bridging area and in parallel with the first portion of the first OHT track;
on condition that the first vehicle and the second vehicle are aligned and travelling at a same speed along a same direction along the first portion of the first OHT track and the second portion of the second OHT track, respectively, configuring the first vehicle to transfer the wafer to the second vehicle; and performing one or more fabrication processes of the second plurality of fabrication processes to the wafer in the second FAB building.

19. The method of claim 18, wherein the first plurality of fabrication processes comprises front-end-of-line (FEOL) processes configured to form isolation features, gate structures, and source/drain features, the second plurality of fabrication processes comprises back-end-of-line (BEOL) processes configured to form a multilayer interconnect (MLI) structure that interconnects integrated circuit features fabricated by FEOL process.

20. The method of claim 18, further comprising:

on condition that the first vehicle and the second vehicle are aligned and travelling at a same speed along a same direction along the first portion of the first OHT track and the second portion of the second OHT track, respectively, further configuring the second vehicle to transfer a payload container to the first vehicle.

* * * * *